US011719988B2

(12) United States Patent
Morita

(10) Patent No.: US 11,719,988 B2
(45) Date of Patent: Aug. 8, 2023

(54) ELECTRO-OPTICAL DEVICE AND ELECTRONIC APPARATUS

(71) Applicant: SEIKO EPSON CORPORATION, Tokyo (JP)

(72) Inventor: Kikuya Morita, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/488,328

(22) Filed: Sep. 29, 2021

(65) Prior Publication Data

US 2022/0100015 A1    Mar. 31, 2022

(30) Foreign Application Priority Data

Sep. 30, 2020   (JP) ................................. 2020-165284

(51) Int. Cl.
*G02F 1/1368*    (2006.01)
*G02F 1/1362*    (2006.01)

(52) U.S. Cl.
CPC ...... *G02F 1/1368* (2013.01); *G02F 1/136209* (2013.01); *G02F 1/136286* (2013.01)

(58) Field of Classification Search
CPC ........... H01L 27/1255; H01L 29/78633; H01L 27/124; H01L 29/4925; H01L 27/1237; H01L 29/7833; H01L 29/41733; H01L 27/1248; G02F 1/136209; G02F 1/136286; G02F 1/1368; G02F 1/136213; G02F 1/133512; G02F 1/136277; G03B 21/006
See application file for complete search history.

(56) References Cited

U.S. PATENT DOCUMENTS

| | | | |
|---|---|---|---|
| 8,207,534 B2 | 6/2012 | Lee et al. | |
| 8,288,771 B2 | 10/2012 | Lee et al. | |
| 8,455,277 B2 | 6/2013 | Lee et al. | |
| 2006/0108587 A1 | 5/2006 | Lee et al. | |
| 2008/0143664 A1* | 6/2008 | Nakagawa | G02F 1/1368 345/92 |
| 2010/0072503 A1* | 3/2010 | Nakagawa | H01L 27/124 257/408 |
| 2017/0213511 A1* | 7/2017 | Tomida | G02F 1/136286 |
| 2018/0210278 A1 | 7/2018 | Hoka et al. | |

(Continued)

FOREIGN PATENT DOCUMENTS

| | | |
|---|---|---|
| JP | H11-202360 | 7/1999 |
| JP | 2006-133769 | 5/2006 |

(Continued)

*Primary Examiner* — Hoan C Nguyen
(74) *Attorney, Agent, or Firm* — JCIPRNET

(57) ABSTRACT

In an electro-optical device, a first light shielding wall and a second light shielding wall pass through sides of a semiconductor layer of a transistor respectively, and reach a scan line on a lower layer side. In a second interlayer insulating layer, a first contact hole and a second contact hole that reach a first source drain region and a second source drain region of the semiconductor layer respectively are provided. Respective widths of the first source drain region and the second source drain region are equal to or less than respective widths of the first contact hole and the second contact hole. Accordingly, the first light shielding wall and the second light shielding wall extend to sides of the first contact hole and the second contact hole respectively.

12 Claims, 19 Drawing Sheets

(56) References Cited

U.S. PATENT DOCUMENTS

| | | | | |
|---|---|---|---|---|
| 2019/0196281 A1* | 6/2019 | Oikawa | ................. | H01L 27/124 |
| 2019/0317345 A1* | 10/2019 | Ito | ..................... | H01L 29/78621 |
| 2019/0391455 A1* | 12/2019 | Izawa | ............... | G02F 1/136227 |

FOREIGN PATENT DOCUMENTS

| | | | | |
|---|---|---|---|---|
| JP | 2009063958 A | * | 3/2009 | |
| JP | 2013-246358 | | 12/2013 | |
| JP | 2018-120110 | | 8/2018 | |
| WO | 2018074060 | | 4/2018 | |
| WO | WO2018074060 A1 | * | 4/2018 | |

* cited by examiner

ELECTRO-OPTICAL DEVICE AND ELECTRONIC APPARATUS

The present application is based on, and claims priority from JP Application Serial Number 2020-165284, filed Sep. 30, 2020, the disclosure of which is hereby incorporated by reference herein in its entirety.

BACKGROUND

1. Technical Field

The present disclosure relates to an electro-optical device in which a scan line is provided in a layer between a light transmissive member and a transistor, and to an electronic apparatus.

2. Related Art

An electro-optical device such as a liquid crystal device used as a light valve of a projection-type display device is provided with a semiconductor layer between a transmissive substrate body and a pixel electrode, and a transistor is configured using the semiconductor layer. In such an electro-optical device, when light incident from the substrate side is incident on or near a channel region of the transistor, an optical leakage current is generated in the transistor. Therefore, structure has been proposed in which an interlayer insulating layer is provided between a substrate body and a semiconductor layer, a light shielding scan line overlapping in plan view with the semiconductor layer is provided between the substrate body and the interlayer insulating layer, and light incident from the substrate body side is shielded by the scan line (see JP 2013-246358 A and WO 2018/074060). In addition, in JP 2013-246358 and WO 2018/074060, a technology has been proposed in which a groove is provided at a side of the semiconductor layer, and a gate electrode and the scan line are electrically coupled, and a light shielding wall for the semiconductor layer is configured, by a light shielding conductive film provided inside the groove. Furthermore, in the technology described in JP 2013-246358 A and WO 2018/074060, a width of the semiconductor layer is increased by providing a protruding portion protruding in a direction intersecting an extension direction of the semiconductor layer at an end portion of the semiconductor layer such that a contact hole that electrically couples a source drain electrode and the semiconductor layer overlaps in plan view with the protruding portion.

In the technology described in JP 2013-246358 A and WO 2018/074060, it is desirable to extend the light shielding wall longer along the semiconductor layer in order to enhance a light shielding effect due to the light shielding wall, but in this case, there is a possibility that the protruding portion and the light shielding wall are short-circuited. Accordingly, a width of the scan line needs to be increased, because the light shielding wall is extended at a position sufficiently spaced from the protruding portion in a width direction. As a result, a pixel opening ratio indicating a ratio occupied by a region through which light can be transmitted in one pixel is reduced. Therefore, in existing structure, there is a problem in that a high pixel opening ratio cannot be obtained, when a light shielding property due to the light shielding wall is increased.

SUMMARY

To solve the above problem, an aspect of an electro-optical device according to the present disclosure includes a substrate body, a transistor including a semiconductor layer including a channel region, a first contact region spaced apart from the channel region, and a second contact region spaced apart from the channel region toward a side opposite to the first contact region, a first interlayer insulating layer provided in a layer between the substrate body and the semiconductor layer, a light shielding layer overlapping in plan view with the semiconductor layer in a layer between the substrate body and the first interlayer insulating layer, a first light shielding wall penetrating the first interlayer insulating layer so as to reach the light shielding layer through a side of the semiconductor layer, a second light shielding wall penetrating the first interlayer insulating layer so as to reach the light shielding layer on a side of the semiconductor layer opposite to the first light shielding wall, and a second interlayer insulating layer configured to cover the transistor from a side opposite to the substrate body, wherein the second interlayer insulating layer is provided with a first contact hole extending through the second interlayer insulating layer to reach the first contact region, and a width of the first contact region is the same as a width of a first opening portion of the first contact hole that opens on a side of the first contact region, or is less than the width of the first opening portion.

The electro-optical device to which the present disclosure is applied is used for a variety of electronic apparatuses. In the present disclosure, when an electronic apparatus is a projection-type display apparatus, the projection-type display apparatus is provided with a light-source unit configured to emit a light to be supplied to the electro-optical device, and a projection optical system configured to project light modulated by the electro-optical device.

DESCRIPTION OF EXEMPLARY EMBODIMENTS

Figure 1:
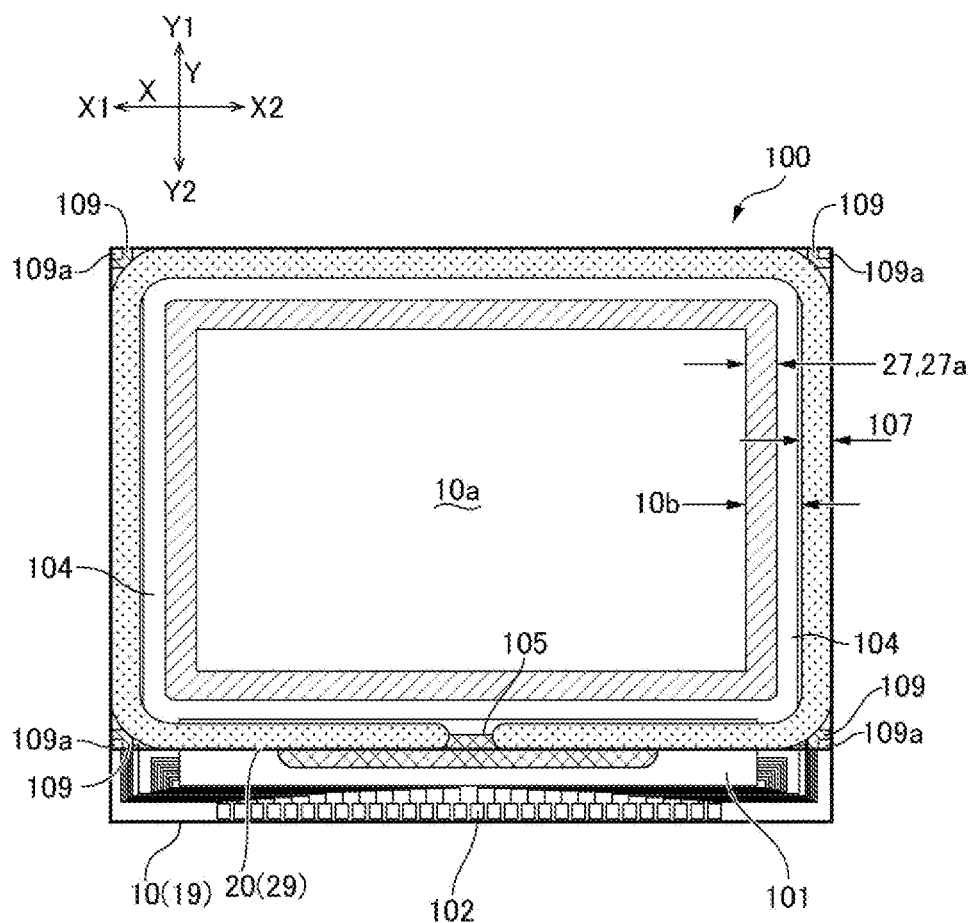
FIG. 1 is a plan view of an electro-optical device according to Exemplary Embodiment 1 of the present disclosure.

Exemplary embodiments of the disclosure will be described below with reference to the drawings. Note that, in each of the figures to be referred to in the following description, to illustrate each layer, each member, and the like in a recognizable size in the drawings, each layer, each member, and the like are illustrated at a different scale. Moreover, in the description described below, when each layer formed in a first substrate 10 is described, an upper layer side or a front surface side means a side (a side on which a second substrate 20 is located) opposite to a side on which a substrate body 19 is located, and a bottom layer side means a side on which the substrate body 19 is located. In addition, of two directions intersecting in in-plane directions of the first substrate 10, a direction in which a scan line 3a extends is referred to as a first direction X, and a direction in which a data line 6a extends is referred to as a second direction Y. In addition, one side in a direction along the first direction X is referred to as one side X1 in the first direction X, another side in the direction along the first direction X is referred to as another side X2 in the first direction X, one side in a direction along the second direction Y is referred to as one side Y1 in the second direction Y, and another side in the direction along the second direction Y is referred to as another side Y2 in the second direction Y.

Additionally, in the present disclosure, a "width direction" refers to a direction orthogonal to an extension direction. For example, since the scan line 3a and a semiconductor layer 31a described below extend in the first direction X, both a width direction of the scan line 3a and a width direction of the semiconductor layer 31a are the second direction Y.

Exemplary Embodiment 1

1. Configuration of Electro-Optical Device 100

Figure 2:
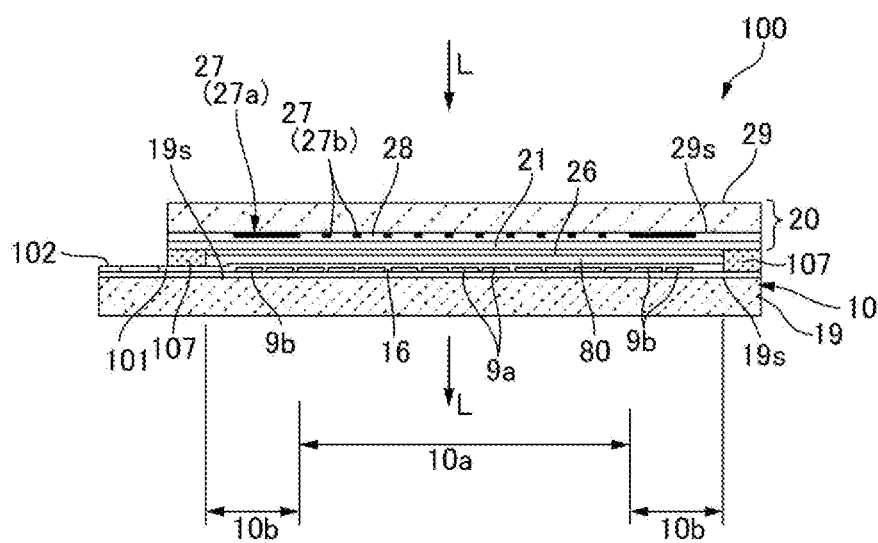
FIG. 2 is a cross-sectional view of the electro-optical device illustrated in FIG. 1.

FIG. 1 is a plan view of an electro-optical device 100 according to Exemplary Embodiment 1 of the present disclosure. FIG. 2 is a cross-sectional view illustrating the electro-optical device 100 illustrated in FIG. 1. As illustrated in FIG. 1 and FIG. 2, in the electro-optical device 100, the first substrate 10 and the second substrate 20 are bonded together with a seal material 107 creating a predetermined gap, where the first substrate 10 is opposed to the second substrate 20. The seal material 107 is provided in a frame-like shape in conformance with the outer edge of the second substrate 20. An electro-optical layer 80 such as a liquid crystal layer is provided in an area surrounded by the seal material 107 between the first substrate 10 and the second substrate 20. The seal material 107 is a photocurable adhesive, or a photocurable and thermosetting adhesive, and a gap material such as glass fiber or glass beads for setting a distance between the substrates to a predetermined value is compounded in the seal material 107. In the present exemplary embodiment, the first substrate 10 and the second substrate 20 both have a quadrangle shape, and in a substantially central portion of the electro-optical device 100, a display region 10a is provided as a quadrangle region. In accordance with such a shape, the seal material 107 is also provided in a substantially quadrangular shape, and a peripheral area 10b having a rectangular frame shape is provided between an inner peripheral edge of the seal material 107 and an outer peripheral edge of the display region 10a.

The first substrate 10 includes the transmissive substrate body 19 such as a quartz substrate or a glass substrate. On one surface 19s side of the substrate body 19 on the second substrate 20 side, on an outer side of the display region 10a, a data line driving circuit 101 and a plurality of terminals 102 are provided along one side of the first substrate 10. A scan line driving circuit 104 is provided along other sides adjacent to the one side. Although not illustrated, a flexible wiring substrate is coupled to the terminals 102, and various types of potential and various signals are input to the first substrate 10 via the flexible wiring substrate.

On the one surface 19s side of the substrate body 19, in the display region 10a, a plurality of transmissive pixel electrodes 9a formed of an Indium Tin Oxide (ITO) film and the like are formed in a matrix, and each of the plurality of pixel electrodes 9a forms a pixel. A first oriented film 16 is formed on the second substrate 20 side with respect to the pixel electrodes 9a, and the pixel electrodes 9a are covered with the first oriented film 16. Accordingly, from the substrate body 19 to the first oriented film 16 correspond to the first substrate 10.

The second substrate 20 includes a transmissive substrate body 29 such as a quartz substrate or a glass substrate. On one surface 29s side, which faces the first substrate 10, of the substrate body 29, a transmissive common electrode 21 including, for example an ITO film, is formed. A second oriented film 26 is formed on the first substrate 10 side with respect to the common electrode 21. Therefore, from the substrate body 29 to the second oriented film 26 correspond to the second substrate 20. The common electrode 21 is formed over substantially the entire surface of the second substrate 20, and is covered with the second oriented film 26. On the second substrate 20, a light shielding member 27 including resin, metal, or a metal compound is formed between the substrate body 29 and the common electrode 21. A transmissive protective film 28 is formed between the light shielding member 27 and the common electrode 21. The light shielding member 27 is formed, for example, as a parting 27a in a frame-like shape extending along the outer peripheral edge of the display region 10a. The light shielding member 27 is also formed as a black matrix 27b in regions overlapping in plan view with regions each located between the pixel electrodes 9a adjacent to each other. Regions overlapping, when viewed in plan view, with the parting 27a in the peripheral area 10b of the first substrate 10 are formed with dummy pixel electrodes 9b formed simultaneously with the pixel electrodes 9a. Note that, a lens may be provided at a position facing the pixel electrode 9a at the second substrate 20, and in this case, the black matrix 27b is often not formed.

Any of the first oriented film 16 and the second oriented film 26 is an inorganic oriented film including a diagonally vapor-deposited film of $SiO_x$ (x<2), $SiO_2$, $TiO_2$, MgO, $Al_2O_3$, and the like, and liquid crystal molecules having negative dielectric anisotropy used for the electro-optical layer 80 are tilt-oriented. Therefore, the liquid crystal molecules form a predetermined angle with respect to the first substrate 10 and the second substrate 20. In the present exemplary embodiment, the first oriented film 16 and the second oriented film 26 are made of silicon oxide. In this way, the electro-optical device 100 is constituted as a liquid crystal device of a Vertical Alignment (VA) mode.

The first substrate 10 includes an inter-substrate conduction electrode 109 being formed in a region positioning outside the seal material 107 and overlapping with a corner portion of the second substrate 20 such that electrical conduction is established between the first substrate 10 and the second substrate 20. An inter-substrate conduction material 109a including conductive particles is disposed in the inter-substrate conduction electrode 109. The common electrode 21 of the second substrate 20 is electrically coupled to the first substrate 10 side via the inter-substrate conduction material 109a and the inter-substrate conduction electrode 109. Therefore, common potential is applied to the common electrode 21 from the first substrate 10 side.

In the electro-optical device 100, the pixel electrodes 9a and the common electrode 21 are formed of a transmissive conductive film such as an ITO film, and the electro-optical device 100 is constituted as a transmissive liquid crystal device. In the electro-optical device 100, of the first substrate 10 and the second substrate 20, light that is incident to the electro-optical layer 80 from either one of the substrates is modulated while passing through the other substrate and being emitted, and displays an image. In the present exemplary embodiment, the electro-optical device 100 displays an image by the light incident from the second substrate 20 being modulated by the electro-optical layer 80 for each of the pixels while passing through the first substrate 10 and being emitted, as indicated by an arrow L.

2. Schematic Configuration of Pixel

Figure 3:
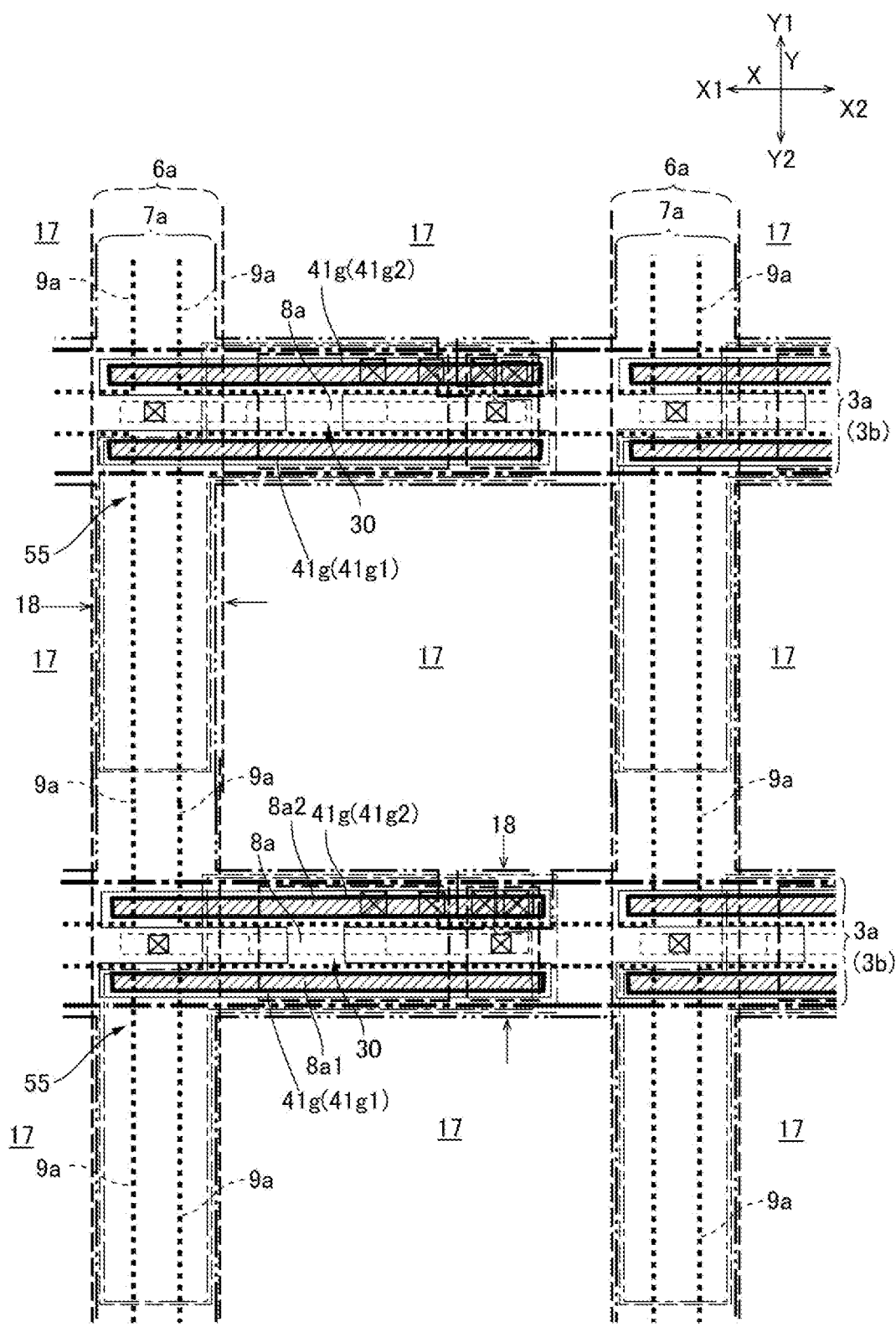
FIG. 3 is a plan view of a plurality of pixels adjacent to each other in the electro-optical device illustrated in FIG. 1.
Figure 4:
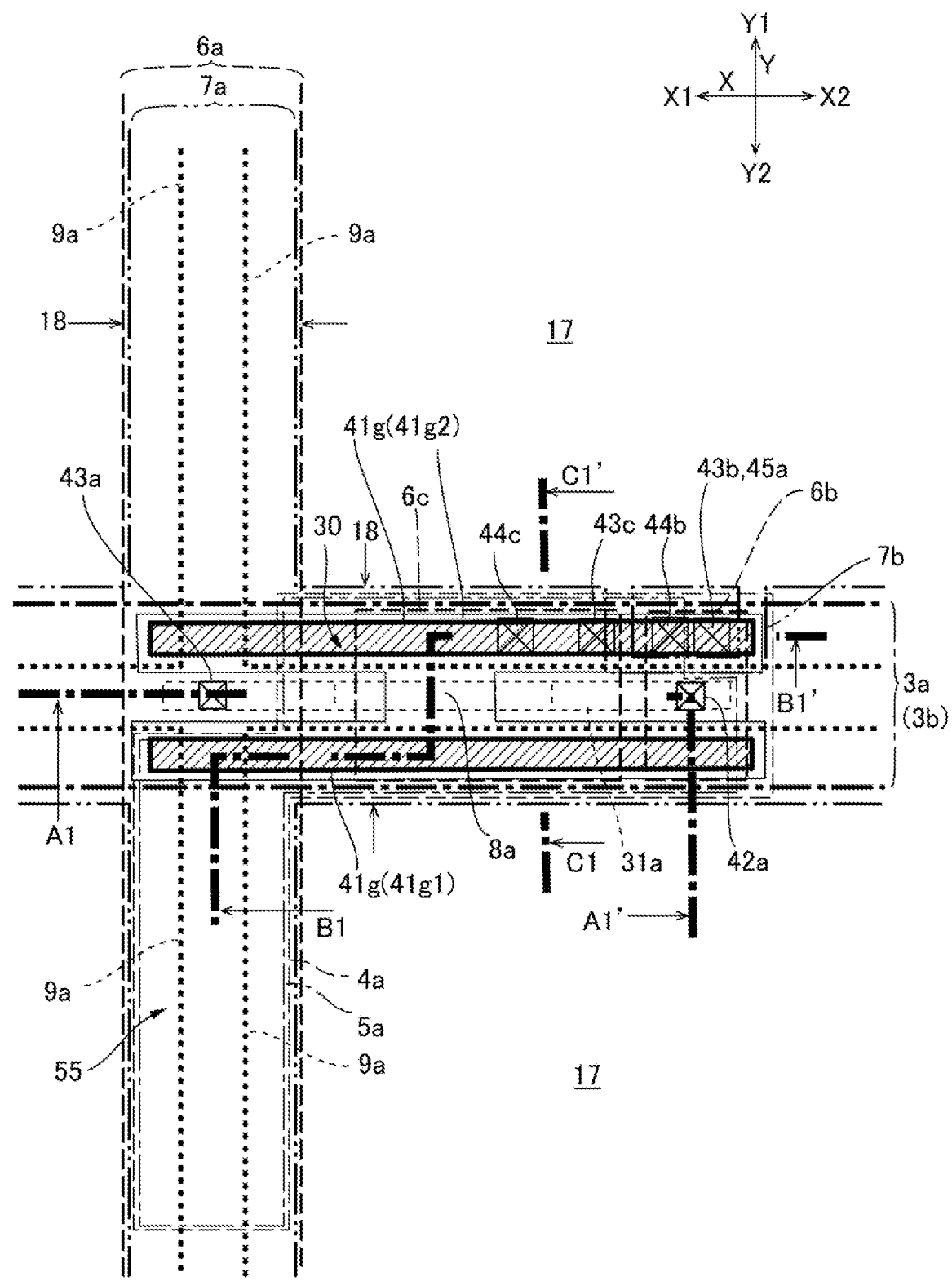
FIG. 4 is an enlarged plan view illustrating one of the pixels illustrated in FIG. 3.
Figure 5:
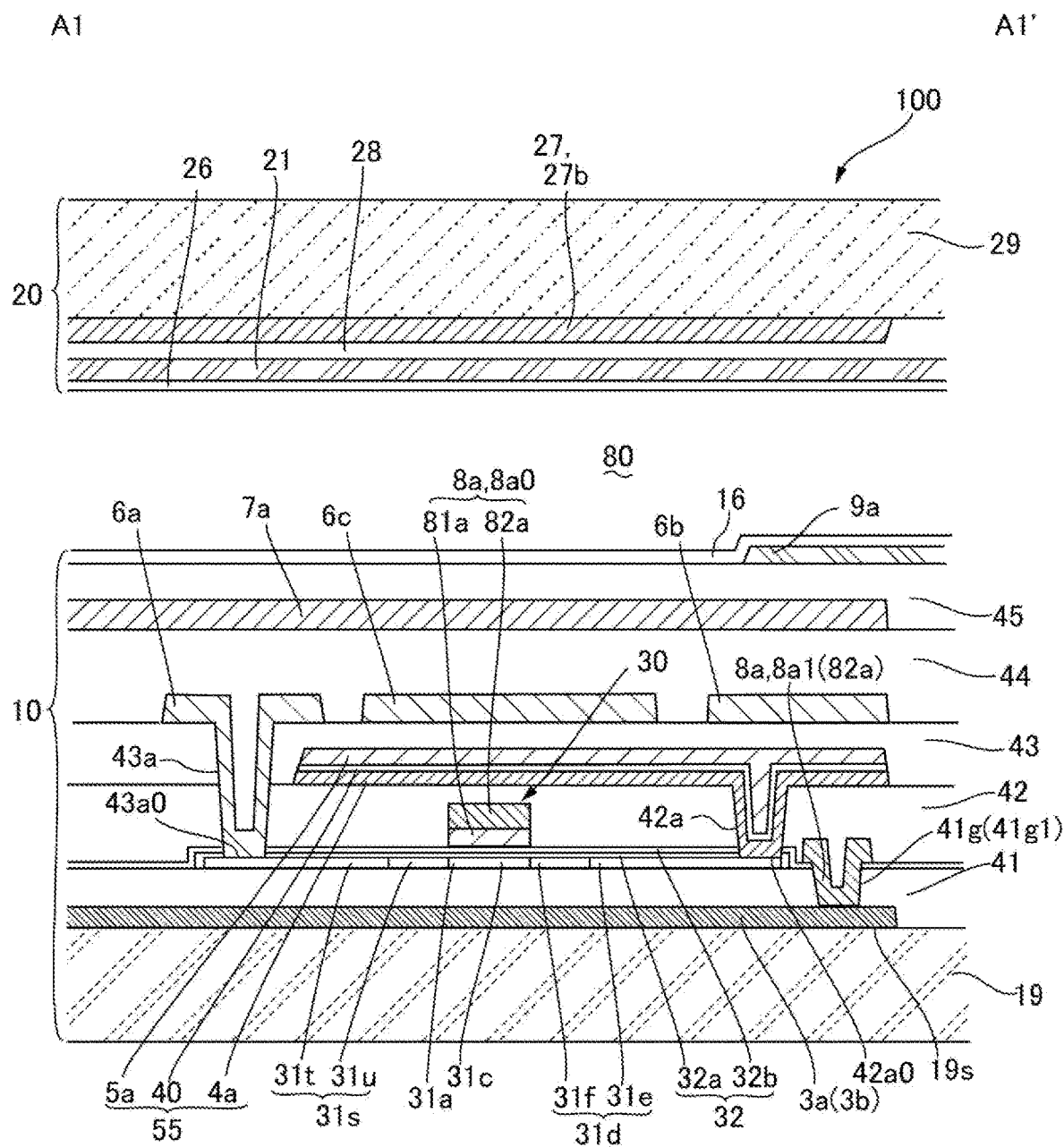
FIG. 5 is an A1-A1' cross-sectional view of FIG. 4.
Figure 6:
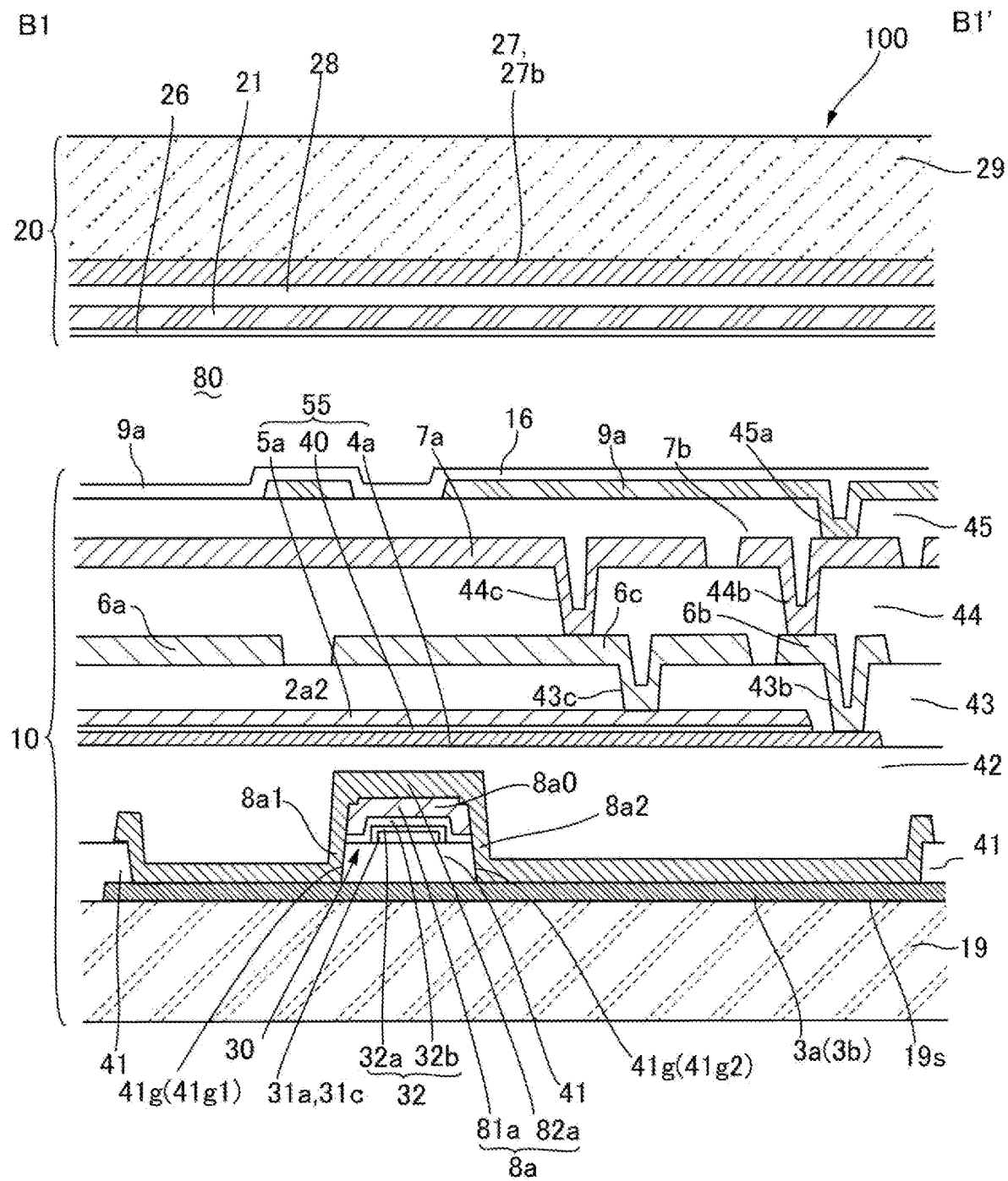
FIG. 6 is a B1-B1' cross-sectional view of FIG. 4.
Figure 7:
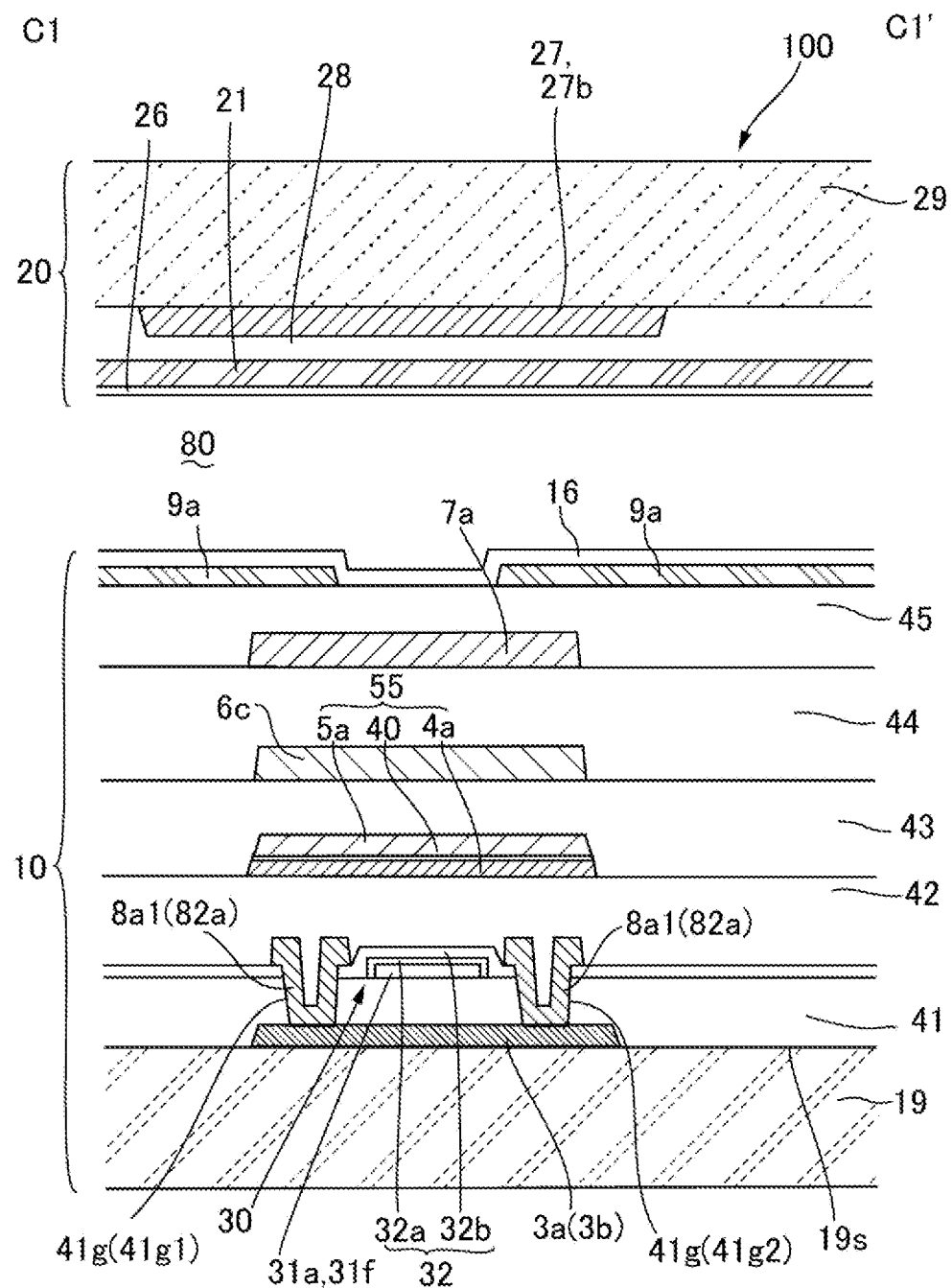
FIG. 7 is a C1-C1' cross-sectional view of FIG. 4.

FIG. 3 is a plan view of a plurality of pixels adjacent to each other in the electro-optical device 100 illustrated in FIG. 1. FIG. 4 is an enlarged plan view illustrating one of the pixels illustrated in FIG. 3, and FIG. 4 illustrates a vicinity of a transistor 30 enlarged. FIG. 5 is the A1-A1' cross-sectional view of FIG. 4. FIG. 6 is the B1-B1' cross-sectional view of FIG. 4. FIG. 7 is the C1-C1' cross-sectional view of FIG. 4. Note that, in FIG. 3, FIG. 4, and FIG. 8 to FIG. 10 to be described later, layers are indicated by the lines below. Further note that in FIGS. 3 and 4, and FIGS. 8 to 10 described below, positions of end portions of layers, the end portions being overlapped in plan view with each other, are shifted to make a shape and the like of the layer easily recognizable. Additionally, in FIG. 3, FIG. 4, and FIG. 8, a groove 41g is illustrated as a region marked with lines inclined upward right.

The scan line 3a is indicated by a thick long dashed short dashed line

The semiconductor layer 31a is indicated by a thin and short dashed line

A gate electrode 8a is indicated by a thin solid line

A first capacitance electrode 4a is indicated by a thin and long dashed line

A second capacitance electrode 5a is indicated by a thin long dashed short dashed line The data line 6a and relay electrodes 6b and 6c are each indicated by a thick and long dashed line A capacitance line 7a and a relay electrode 7b are each indicated by a thick two-dot chain line The pixel electrode 9a is indicated by a thick short dashed line As illustrated in FIGS. 3 and 4, the pixel electrode 9a is formed in each of the plurality of pixels on a surface of the first substrate 10 facing the second substrate 20, where the scan line 3a, the data line 6a, and the capacitance line 7a extend along an inter-pixel region between the pixel electrodes 9a adjacent to each other. The data line 6a extends in the second direction Y in the inter-pixel region. The scan line 3a extends in the first direction X in the inter-pixel region. The capacitance line 7a extends in the first direction X and the second direction Y in the inter-pixel region. Further, the transistor 30 is formed corresponding to an intersection between the data line 6a and the scan line 3a. Note that, the scan line 3a, the data line 6a, and the capacitance line 7a each have a light shielding property. Accordingly, a region where the scan line 3a, the data line 6a, the capacitance line 7a, and an electrode in the same layer as these lines are formed serves as the light shielding region 18 through which light does not transmit, and a region surrounded by the light shielding region 18 serves as an aperture region 17 through which light transmits. In addition, a ratio occupied by the aperture region 17 in one pixel corresponds to a pixel opening ratio.

As illustrated in FIGS. 5, 6, and 7, in the first substrate 10, a first interlayer insulating layer 41 is provided in a layer between the substrate body 19 and the semiconductor layer 31a of the transistor 30, and a light shielding layer 3b is provided in a layer between the substrate body 19 and the first interlayer insulating layer 41. In the present exemplary embodiment, the light shielding layer 3b is configured as the scan line 3a. A second interlayer insulating layer 42 that covers the transistor 30 from an opposite side to the substrate body 19 is provided at the first substrate 10. In addition, interlayer insulating layers 43, 44, and 45 are sequentially stacked in a layer between the second interlayer insulating layer 42 and the pixel electrode 9a. The first interlayer insulating layer 41, the second interlayer insulating layer 42, and the interlayer insulating layers 43, 44, and 45 each include a transmissive insulating film such as silicon oxide. In the present exemplary embodiment, the first interlayer insulating layer 41, the second interlayer insulating layer 42, and the interlayer insulating layer 45 each have a surface on the pixel electrode 9a side that is a continuous plane by a flattening process such as chemical mechanical polishing or the like.

3. Detailed Description of Each Layer

Figure 8:
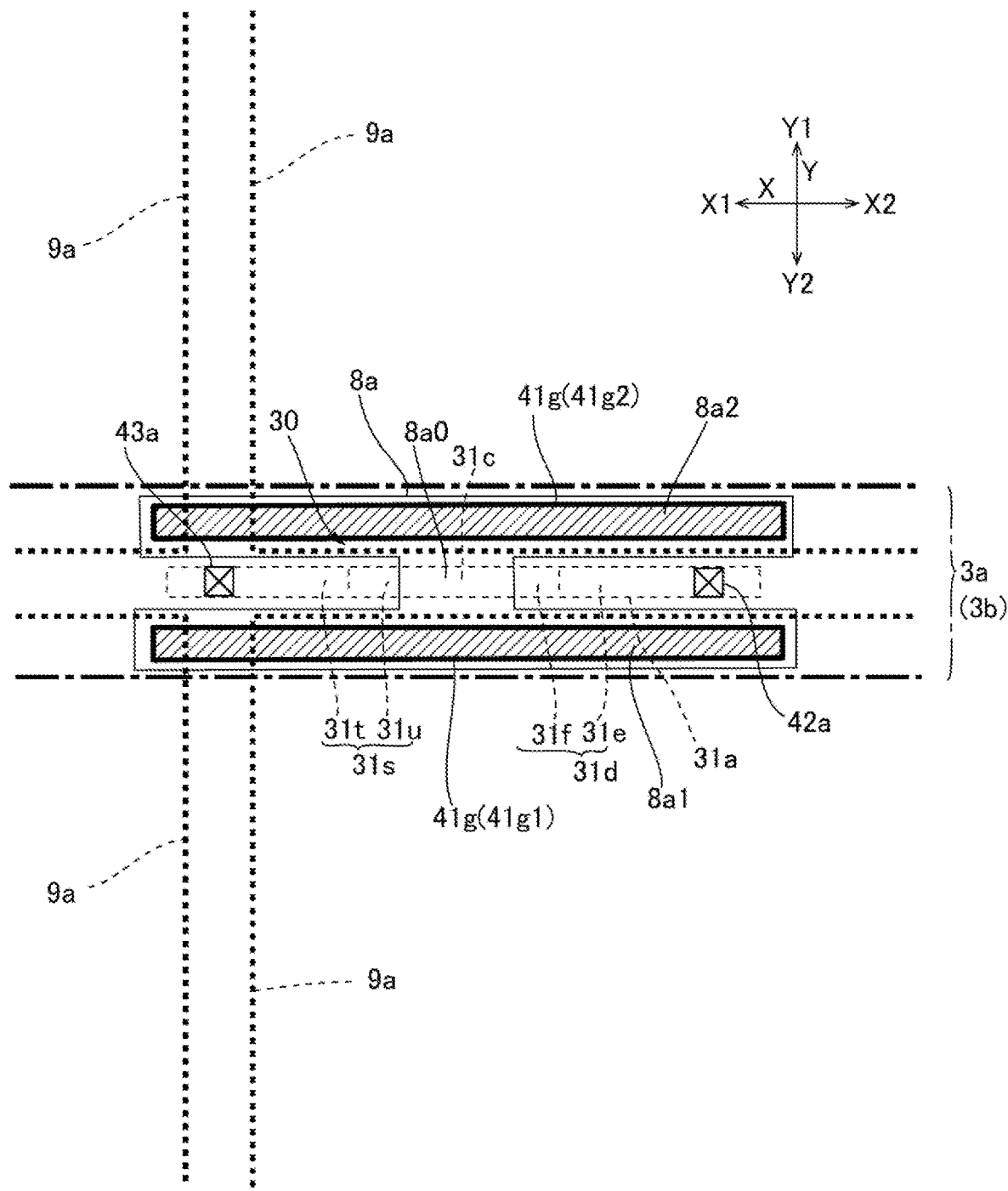
FIG. 8 is a plan view of a scan line, a semiconductor layer, a gate electrode, and the like illustrated in FIG. 5 and FIG. 6.
Figure 9:
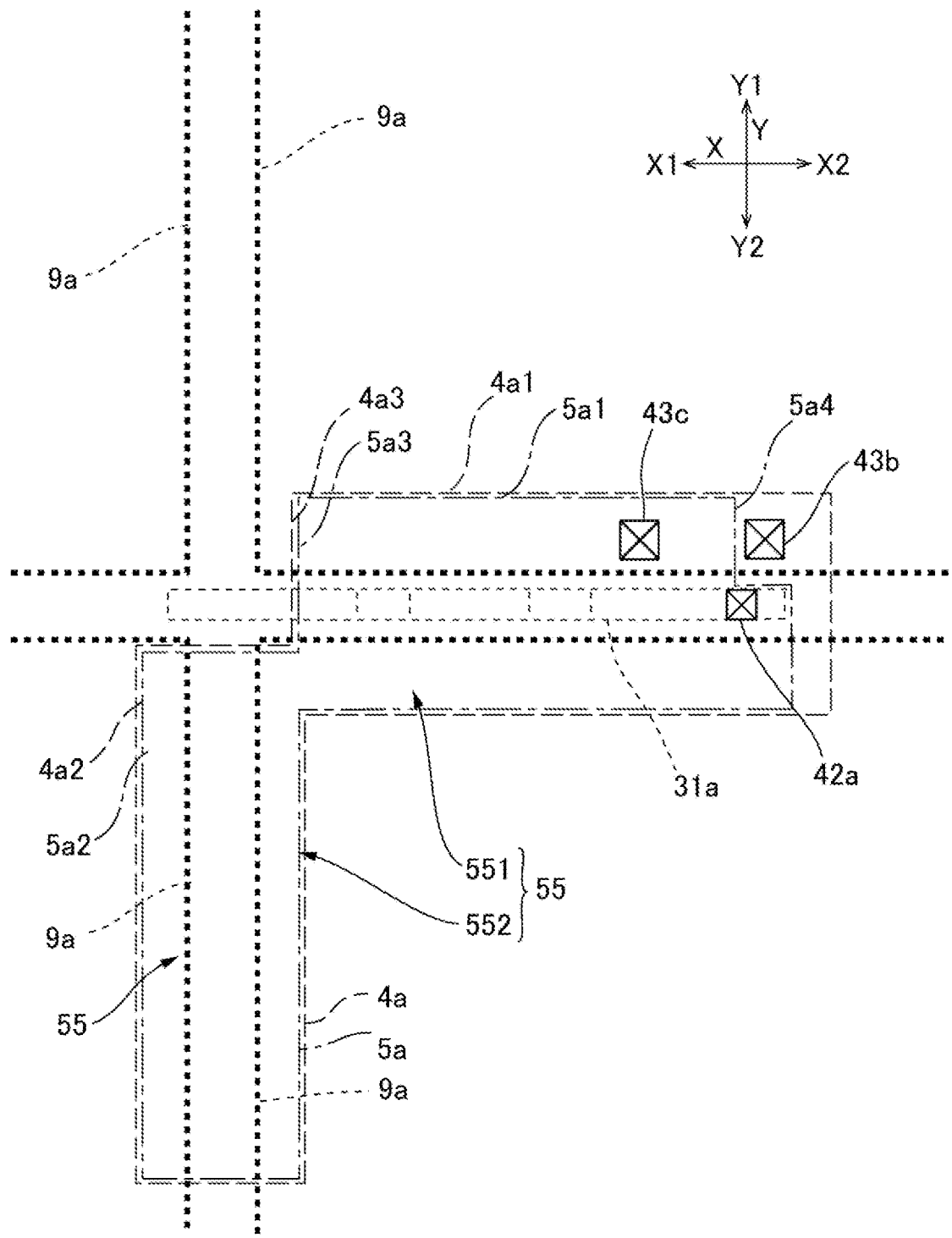
FIG. 9 is a plan view of first capacitance electrodes, second capacitance electrodes, and the like illustrated in FIG. 5 and FIG. 6.
Figure 10:
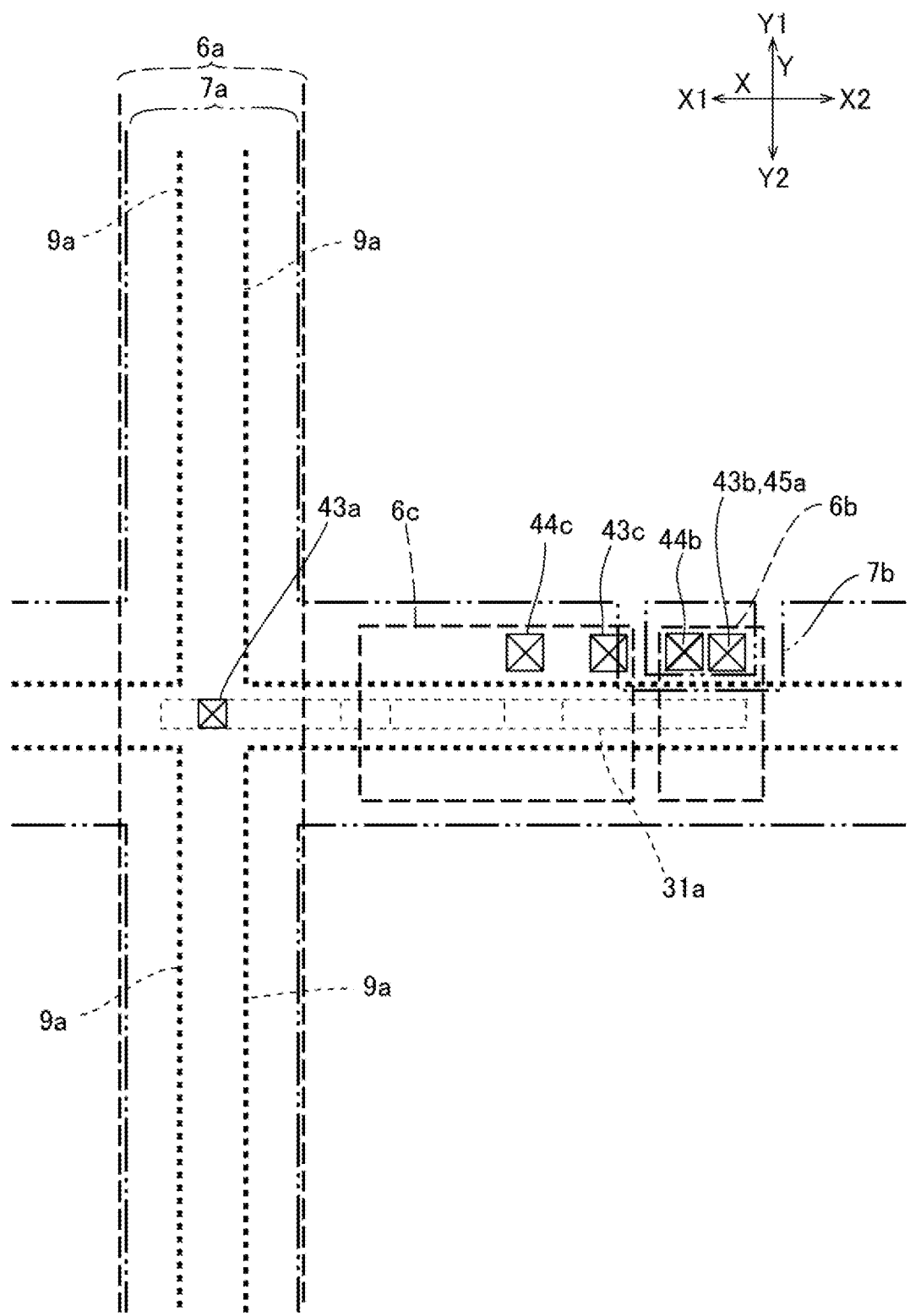
FIG. 10 is a plan view of a data line, a capacitance line, and the like illustrated in FIG. 5 and FIG. 6.

A detailed configuration of the first substrate 10 will be described with reference to FIG. 5, FIG. 6, and FIG. 7 while referring to FIG. 8 to FIG. 10 described below as necessary. FIG. 8 is a plan view of the scan line 3a, the semiconductor layer 31a, the gate electrode 8a, and the like illustrated in FIG. 5 and FIG. 6. FIG. 9 is a plan view of the first capacitance electrode 4a, the second capacitance electrode 5a, and the like illustrated in FIG. 5 and FIG. 6. FIG. 10 is a plan view of the data line 6a, the capacitance line 7a, and the like illustrated in FIG. 5 and FIG. 6. Note that FIGS. 8 to 10 each illustrate a contact hole related to electrical coupling of the electrodes and the like illustrated in those drawings, and each illustrate the semiconductor layer 31a and the pixel electrode 9a for indicating a position to be referenced.

First, as illustrated in FIGS. 5 and 6, in the first substrate 10, a light shielding layer 3b is provided in a layer between the substrate body 19 and the first interlayer insulating layer

41. In the present exemplary embodiment, the light shielding layer 3b constitutes the scan line 3a that extends along the first direction X. The light shielding layer 3b is formed of a light shielding conductive film such as a metal film or a metal compound film. In the present exemplary embodiment, the light shielding layer 3b is formed of tungsten silicide, tungsten, titanium nitride, and the like.

In a layer between the first interlayer insulating layer 41 and the second interlayer insulating layer 42 is formed the transistor 30 for pixel switching. The transistor 30 includes the semiconductor layer 31a formed at a surface of the first interlayer insulating layer 41 on an opposite side to the substrate body 19, a gate insulating film 32 stacked on the pixel electrode 9a side of the semiconductor layer 31a, and the gate electrode 8a overlapping in plan view with the semiconductor layer 31a on the pixel electrode 9a side of the gate insulating film 32. The semiconductor layer 31a includes a polysilicon film. The gate insulating layer 32 has two-layer structure including a first gate insulating film 32a including a silicon oxide film that is obtained by thermally oxidizing the semiconductor layer 31a, and a second gate insulating layer 32b including a silicon oxide film that is formed by using, for example, a low-pressure CVD method. The gate electrode 8a is formed of a conductive film such as a conductive polysilicon film, a metal film, or a metal compound film.

As illustrated in FIG. 8, the scan line 3a extends linearly along the first direction X with the same width dimension. The semiconductor layer 31a extends from an intersecting portion of the scan line 3a and the data line 6a to the other side X2 in the first direction X, and overlaps in plan view with the scan line 3a. A portion of the semiconductor layer 31a overlapping in plan view with the gate electrode 8a is a channel region 31c. In the present exemplary embodiment, the transistor 30 has lightly doped drain (LDD) structure. Accordingly, in the semiconductor layer 31a, a pixel electrode side source drain region 31d on the other side X2 in the first direction X with respect to the channel region 31c includes a first contact region 31e spaced apart from the channel region 31c in the first direction X, and a first low concentration region 31f sandwiched between the first contact region 31e and the channel region 31c, and the first low concentration region 31f has lower impurity concentration compared to the first contact region 31e. In addition, in the semiconductor layer 31a, a data line side source drain region 31s on the other side X1 in the first direction X with respect to the channel region 31c includes a second contact region 31t spaced apart from the channel region 31c on an opposite side to the first contact region 31e, and a second low concentration region 31u sandwiched between the second contact region 31t and the channel region 31c, and the second low concentration region 31u has lower impurity concentration compared to the second contact region 31t. A portion of each of the first contact region 31e and the second contact region 31t is used for electrical coupling with an electrode or wiring on an upper layer side.

Figure 11:
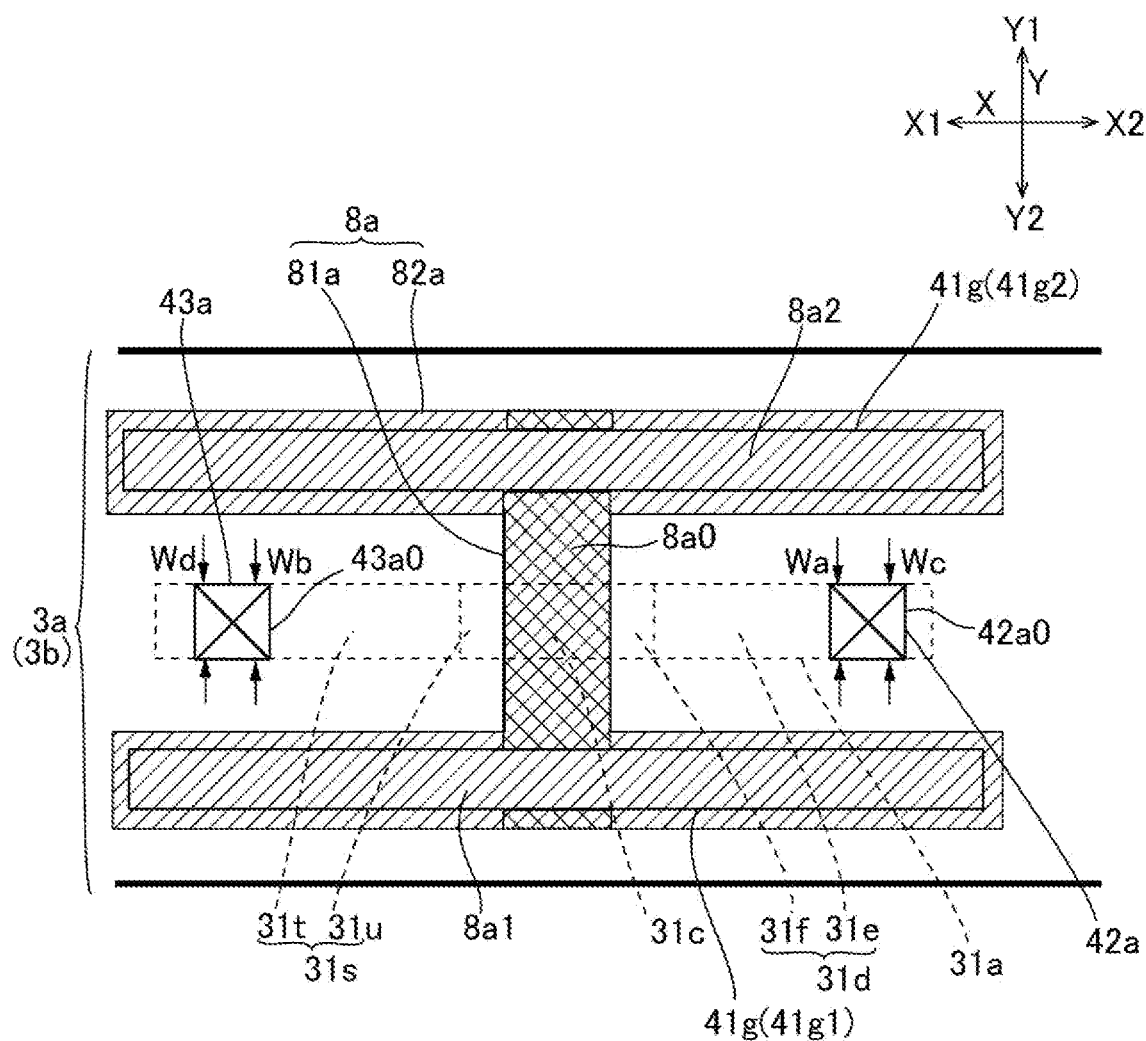
FIG. 11 is an enlarged plan view of a periphery of the semiconductor layer illustrated in FIG. 8.

As illustrated in FIG. 6, FIG. 7, and FIG. 8, the groove 41g for electrically coupling the scan line 3a and the gate electrode 8a of the transistor 30 is provided in the first interlayer insulating layer 41. A light shielding wall described below with reference to FIG. 11 is configured inside the groove 41g.

In FIG. 5 and FIG. 6, on an upper layer side of the transistor 30, a capacitance element 55 is constituted by a stacked film 550 in which the first capacitance electrode 4a, a dielectric film 40, and the second capacitance electrode 5a are sequentially stacked in a layer between the second interlayer insulating layer 42 and the interlayer insulating layer 43. The capacitance element 55 is a retention capacitor that prevents a fluctuation in an image signal retained by a liquid crystal capacitor configured between the pixel electrode 9a and the common electrode 21. The first capacitance electrode 4a and the second capacitance electrode 5a are each formed of a conductive polysilicon film, a metal film, a metal compound film, and the like. In the present exemplary embodiment, the first capacitance electrode 4a and the second capacitance electrode 5a are each formed of a conductive polysilicon film.

As illustrated in FIG. 9, the first capacitance electrode 4a includes a body portion 4a1 that extends in the first direction X so as to overlap in plan view with the scan line 3a and the semiconductor layer 31a, and a protruding portion 4a2 that protrudes from the body portion 4a1 so as to overlap in plan view with the data line 6a, and an end portion of the body portion 4a1 is electrically coupled to the first contact region 31e of the semiconductor layer 31a via a first contact hole 42a formed in the second interlayer insulating layer 42. The first capacitance electrode 4a is formed with a notch 4a3 so as not to overlap in plan view with an end portion of the semiconductor layer 31a overlapping with the data line 6a.

The second capacitance electrode 5a includes a body portion 5a1 that overlaps in plan view with the body portion 4a1 of the first capacitance electrode 4a, and a protruding portion 5a2 that overlaps in plan view with the protruding portion 4a2 of the first capacitance electrode 4a. Accordingly, the capacitance element 55 includes a first element portion 551 that extends in the first direction X so as to overlap with the semiconductor layer 31a, and a second element portion 552 that extends in the second direction Y so as to overlap with the data line 6a. Therefore, capacitance of the capacitance element 55 is large. Similar to the first capacitance electrode 4a, the second capacitance electrode 5a is formed with a notch 5a3, so as not to overlap in plan view with the end portion of the semiconductor layer 31a overlapping with the data line 6a. Also, an end portion of the body portion 5a1 of the second capacitance electrode 5a on the other side X2 in the first direction X is formed with a notch 5a4 so as not to overlap with an end portion of the body portion 4a1 of the first capacitance electrode 4a.

In FIGS. 5 and 6, the interlayer insulating layers 44 and 45 are formed on an upper layer side of the interlayer insulating layer 43. The data line 6a, the relay electrodes 6b, and 6c are provided in a layer between the interlayer insulating layer 43 and the interlayer insulating layer 44. The data line 6a, the relay electrodes 6b, and 6c are formed of the same conductive film. The data line 6a, the relay electrodes 6b, and 6c are each formed of a light shielding conductive film such as a metal film, or a metal compound film. For example, the data line 6a, the relay electrodes 6b, and 6c are each formed of multilayer structure of a titanium layer/titanium nitride layer/aluminum layer/titanium nitride layer, or multilayer structure of a titanium nitride layer/aluminum layer/titanium nitride layer.

A second contact hole 43a is provided in the second interlayer insulating layer 42 and the interlayer insulating layer 43, and the second contact hole 43a penetrates through the gate insulating film 32, the second interlayer insulating layer 42, and the interlayer insulating layer 43. The data line 6a is electrically coupled to the second contact region 31t of the semiconductor layer 31a via the second contact hole 43a. The second contact hole 43a is formed in a portion corresponding to the notch 4a3 of the first capacitance electrode 4a and the notch 5a3 of the second capacitance electrode 5a described with reference to FIG. 9. Accordingly, the second contact hole 43a and the capacitance element 55 can be separated. A contact hole 43b is provided in the interlayer insulating layer 43, and the contact hole 43b penetrates through the interlayer insulating layer 43. The relay electrode 6b is electrically coupled to the first capacitance electrode 4a via the contact hole 43b. The contact hole 43b is formed in a portion corresponding to the notch 5a4 of the second capacitance electrode 5a described with reference to FIG. 9. A contact hole 43c is provided in the interlayer insulating layer 43, and a relay electrode 6c is electrically coupled to the second capacitance electrode 5a via the contact hole 43c. In the present exemplary embodiment, the relay electrode 6c covers at least from the second low concentration region 31u to the first low concentration region 31f of the semiconductor layer 31a from the pixel electrode 9a side, and at least overlaps in plan view with the second low concentration region 31u.

The capacitance line 7a and the relay electrode 7b are provided in an interlayer between the interlayer insulating layer 44 and the interlayer insulating layer 45. The capacitance line 7a and the relay electrode 7b are formed of the same conductive film. The capacitance line 7a and the relay electrode 7b are each formed of a light shielding conductive film such as a metal film, or a metal compound film. For example, the capacitance line 7a and the relay electrode 7b are each formed of multilayer structure of a titanium layer/titanium nitride layer/aluminum layer/titanium nitride layer, or multilayer structure of a titanium nitride layer/aluminum layer/titanium nitride layer.

A contact hole 44c is provided in the interlayer insulating layer 44, and the capacitance line 7a is electrically coupled to the relay electrode 6c via the contact hole 44c. Accordingly, the capacitance line 7a is electrically coupled to the second capacitance electrode 5a via the relay electrode 6c, and common potential is applied to the second capacitance electrode 5a from the capacitance line 7a. A contact hole 44b is provided in the interlayer insulating layer 44, and the relay electrode 7b is electrically coupled to the relay electrode 6b via the contact hole 44b.

A contact hole 45a is formed in the interlayer insulating layer 45, and the pixel electrode 9a is electrically coupled to the relay electrode 7b via the contact hole 45a. Thus, the pixel electrode 9a is electrically coupled to the first capacitance electrode 4a via the relay electrodes 7b and 6b. Here, the first capacitance electrode 4a is electrically coupled to the first contact region 31e of the semiconductor layer 31a via the first contact hole 42a, and thus the pixel electrode 9a is electrically coupled to the first contact region 31e of the semiconductor layer 31a via the first capacitance electrode 4a.

4. Configuration of Light Shielding Wall or the Like

FIG. 11 is an enlarged plan view of a periphery of the semiconductor layer 31a illustrated in FIG. 8. The gate electrode 8a is formed by stacking a polysilicon film 81a and a light shielding conductive film 82a. In FIG. 11, the polysilicon film 81a is marked with lines inclined downward right, and the light shielding conductive film 82a is marked with lines inclined upward right. Therefore, a region marked with the lines inclined downward right and the lines inclined upward right indicates that the polysilicon film 81a and the light shielding conductive film 82a are stacked.

As illustrated in FIG. 11, the grooves 41g are provided as a first groove 41g1 that penetrates through the first interlayer insulating layer 41 so as to reach the scan line 3a through a side of the semiconductor layer 31a, and a second groove 41g2 that penetrates through the first interlayer insulating layer 41 so as to reach the scan line 3a on a side of the semiconductor layer 31a on an opposite side to the first groove 41g1. The first groove 41g1 and the second groove 41g2 extend in the first direction X along the semiconductor layer 31a through both sides of the semiconductor layer 31a, respectively, and overlap in plan view with both the gate electrode 8a and the scan line 3a.

The gate electrode 8a is configured by stacking the conductive polysilicon film 81a extending in the second direction Y so as to intersect with the semiconductor layer 31a, and the light shielding conductive film 82a that covers the polysilicon film 81a. The conductive film 82a is made of a light shielding conductive material that has a higher light shielding property and smaller resistance compared to the polysilicon film 81a. For example, the conductive film 82a is formed of a silicide film such as a tungsten silicide film.

Here, the conductive film 82a is formed over a wider range than the polysilicon film 81a, and covers the entire polysilicon film 81a. Therefore, an electrode portion 8a0 in which the polysilicon film 81a is formed in the gate electrode 8a has two-layer structure of the polysilicon film 81a and the light shielding conductive film 82a, and has single layer structure of the conductive film 82a in a region in the gate electrode 8a where the polysilicon film 81a is not formed. For example, as illustrated in FIGS. 5, 6, and 7, in the gate electrode 8a, each of the first groove 41g1 and the second groove 41g2 is not formed with the polysilicon film 81a inside thereof, and has single layer structure of the conductive film 82a. In contrast, an outer portion of the groove 41g of the electrode portions 8a0 has two-layer structure of the polysilicon film 81a and the conductive film 82a.

The light shielding conductive film 82a that electrically couples the gate electrode 8a and the scan line 3a is formed in the inside of each of the first groove 41g1 and the second groove 41g2. The conductive film 82a is provided along an entire inner wall of each of the first groove 41g1 and the second groove 41g2. Accordingly, the conductive film 82a constitutes a first light shielding wall 8a1 penetrating through the first interlayer insulating layer 41 so as to reach the scan line 3a through a side of the semiconductor layer 31a, and a second light shielding wall 8a2 penetrating through the first interlayer insulating layer 41 so as to reach the scan line 3a on a side of the semiconductor layer 31a on an opposite side to the first light shielding wall 8a1. Thus, the gate electrode 8a is electrically coupled to the scan line 3a via the first light shielding wall 8a1 and the second light shielding wall 8a2, and thus is applied with a scan signal from the scan line 3a.

Such a configuration is achieved by the following steps. First, the scan line 3a, the first interlayer insulating layer 41, the semiconductor layer 31a, and the gate insulating film 32 are formed. Next, after a conductive polysilicon film is formed, the polysilicon film is patterned to form the polysilicon film 81a extending in the second direction Y intersecting the semiconductor layer 31a.

Next, while an etching mask is formed, the gate insulating film 32, the polysilicon film 81a, and the first interlayer insulating layer 41 are etched to form the first groove 41g1 and the second groove 41g2. Therefore, the polysilicon film 81a is not present in the inside of each of the first groove 41g1 and the second groove 41g2. Next, after a light shielding conductive film is formed, the light shielding conductive film is patterned to form the light shielding conductive film 82a, as illustrated in FIG. 11. As a result, the first light shielding wall 8a1 is constituted by a portion of the conductive film 82a located inside the first groove 41g1, and the second light shielding wall 8a2 is configured by a portion located inside the second groove 41g2.

5. Configuration of Semiconductor Layer 31a and the Like

In FIG. 5 and FIG. 8, in the second interlayer insulating layer 42, the first contact hole 42a is formed that penetrates through the second interlayer insulating layer 42 and reaches the first contact region 31e, and the first capacitance electrode 4a is electrically coupled to the first contact region 31e via the first contact hole 42a. Further, in the second interlayer insulating layer 42, the second contact hole 43a is formed that penetrates through the second interlayer insulating layer 42 and reaches the second contact region 31t, and the data line 6a is electrically coupled to the second contact region 31t via the second contact hole 43a.

In the present exemplary embodiment, as illustrated in FIG. 11, when a width of the first contact region 31e is Wa, and a width of a first opening portion 42a0 of the first contact hole 42a that opens on a side of the first contact region 31e is Wc, the width Wa is the same as the width of the first opening 42a0 or is less than the width of the first opening 42a0, as illustrated in the following equation.

Wa≤Wc

Further, when a width of the second contact region 31t is Wb, and a width of a second opening portion 43a0 of the second contact hole 43a that opens on a side of the second contact region 31t is Wd, the width Wb is the same as a width of the second opening portion 43a0, or is less than the width of the second opening portion 43a0, as illustrated in the following equation.

Wb≤Wd

In the present exemplary embodiment, the width Wa of the first contact region 31e is equal to the width Wc of the first opening portion 42a0. Accordingly, an edge in a width direction of the first opening portion 42a0 overlaps with an edge in a width direction of the first contact region 31e. Further, the width Wb of the second contact region 31t is equal to the width Wd of the second opening portion 43a0. Accordingly, an edge in a width direction of the second opening portion 43a0 overlaps with an edge in a width direction of the second contact region 31t.

Here, in the semiconductor layer 31a, the channel region 31c and the first contact region 31e extend with the same width, and a protruding portion protruding in the width direction is not provided in the first contact region 31e. Therefore, an area occupied by the first contact region 31e in the width direction is narrow. Thus, in the present exemplary embodiment, the first light shielding wall 8a1 and the second light shielding wall 8a2 are extended from sides of the channel region 31c to sides of the first contact hole 42a respectively. More specifically, the second light shielding wall 8a2 is extended to a position separated farther from the channel region 31c than the side of the second contact hole 43a.

In addition, in the semiconductor layer 31a, the channel region 31c and the second contact region 31t extend with the same width, and a protruding portion protruding in the width direction is not provided in the second contact region 31t. Therefore, the semiconductor layer 31a extends in the first direction X with a constant width. Therefore, an area occupied by the second contact region 31t in the width direction is narrow. Thus, in the present exemplary embodiment, the first light shielding wall 8a1 and the second light shielding wall 8a2 are extended to the sides of the second contact hole 43a respectively. More specifically, the second light shielding wall 8a2 is extended to a position separated farther from the channel region 31c than the side of the second contact hole 43a. Note that, the "same width" may be a width at the time of design or a width when processing is finished.

6. Main Effects of Present Exemplary Embodiment

As described above, in the electro-optical device 100 of the present exemplary embodiment, light incident from the second substrate 20 side is shielded by the data line 6a, the relay electrode 6c, the capacitance line 7a, and the like provided on the second substrate 20 side with respect to the semiconductor layer 31a, so incident on the semiconductor layer 31a is suppressed. Further, even when light emitted from the first substrate 10 side is incident again from the first substrate 10 side, the light is shielded by the scan line 3a provided on the substrate body 19 side with respect to the semiconductor layer 31a, thus incidence on the semiconductor layer 31a is suppressed.

Further, in the first substrate 10, the first light shielding wall 8a1 and the second light shielding wall 8a2 that penetrate through the first interlayer insulating layer 41 and reach the scan line 3a are provided at the side of the semiconductor layer 31a, so that both of light traveling in the second direction Y intersecting the semiconductor layer 31a after being incident from the second substrate 20 side, and light traveling in the second direction Y intersecting the semiconductor layer 31a after being incident from the first substrate 10 side can be shielded by the first light shielding wall 8a1 and the second light shielding wall 8a2.

Further, the width Wa of the first contact region 31e of the semiconductor layer 31a to which the first capacitance electrode 4a is electrically coupled via the first contact hole 42a is less than or equal to the width Wc of the first opening portion 42a0 of the first contact hole 42a, and is narrow. Further, the width Wb of the second contact region 31t of the semiconductor layer 31a to which the data line 6a is electrically coupled via the second contact hole 43a is less than or equal to the width Wd of the second opening portion 43a0 of the second contact hole 43a, and is narrow. Accordingly, the first light shielding wall 8a1 and the second light shielding wall 8a2 can be extended over a wide range from the sides of the channel region 31c to the sides of the first contact hole 42a, and to the sides of the second contact hole 43a respectively. Therefore, light that enters between the semiconductor layer 31a and the first light shielding wall 8a1, or between the semiconductor layer 31a and the second light shielding wall 8a2, and is incident on the semiconductor layer 31a can be shielded. Thus, structure with a high light shielding effect can be realized, and a malfunction caused by a photo current is unlikely to occur in the transistor 30. In addition, because incident of light on the first low concentration region 31f provided between the channel region 31c and the first contact region 31e can be efficiently suppressed, the transistor 30 can sufficiently exhibit characteristics due to LDD structure. In this case as well, since the width of the semiconductor layer 31a is small, it is not necessary to increase the width of the scan line 3a. Therefore, even when the light shielding properties of the first light shielding wall 8a1 and the second light shielding wall 8a2 are enhanced, a high pixel opening ratio can be achieved.

Additionally, in the semiconductor layer 31a, the channel region 31c and the first contact region 31e extend with the same width, and the channel region 31c and the second contact region 31t extend with the same width. In other words, there is no protruding portion in the width direction in the first contact region 31e and the second contact region 31t. Accordingly, an interval between the channel region 31c and the first light shielding wall 8a1 and an interval between the channel region 31c and the second light shielding wall 8a2 can be decreased, and thus structure with a high light shielding effect can be achieved. Additionally, the interval between the channel region 31c and the first light shielding wall 8a1 and the interval between the channel region 31c and the second light shielding wall 8a2 can be decreased, so the width of the scan line 3a can be decreased. Therefore, even when the light shielding properties of the first light shielding wall 8a1 and the second light shielding wall 8a2 are enhanced, a high pixel opening ratio can be achieved.

Further, the gate electrode 8a includes the conductive polysilicon film 81a and the light shielding conductive film 82a, and the light shielding conductive film 82a is provided along a side surface of the groove 41g. Therefore, a light shielding property of the gate electrode 8a is high and resistance is low. In addition, since the conductive polysilicon film 81a is interposed between the conductive film 82a and the gate insulating film 32, a threshold voltage of the transistor 30 is stable.

Exemplary Embodiment 2

Figure 12:
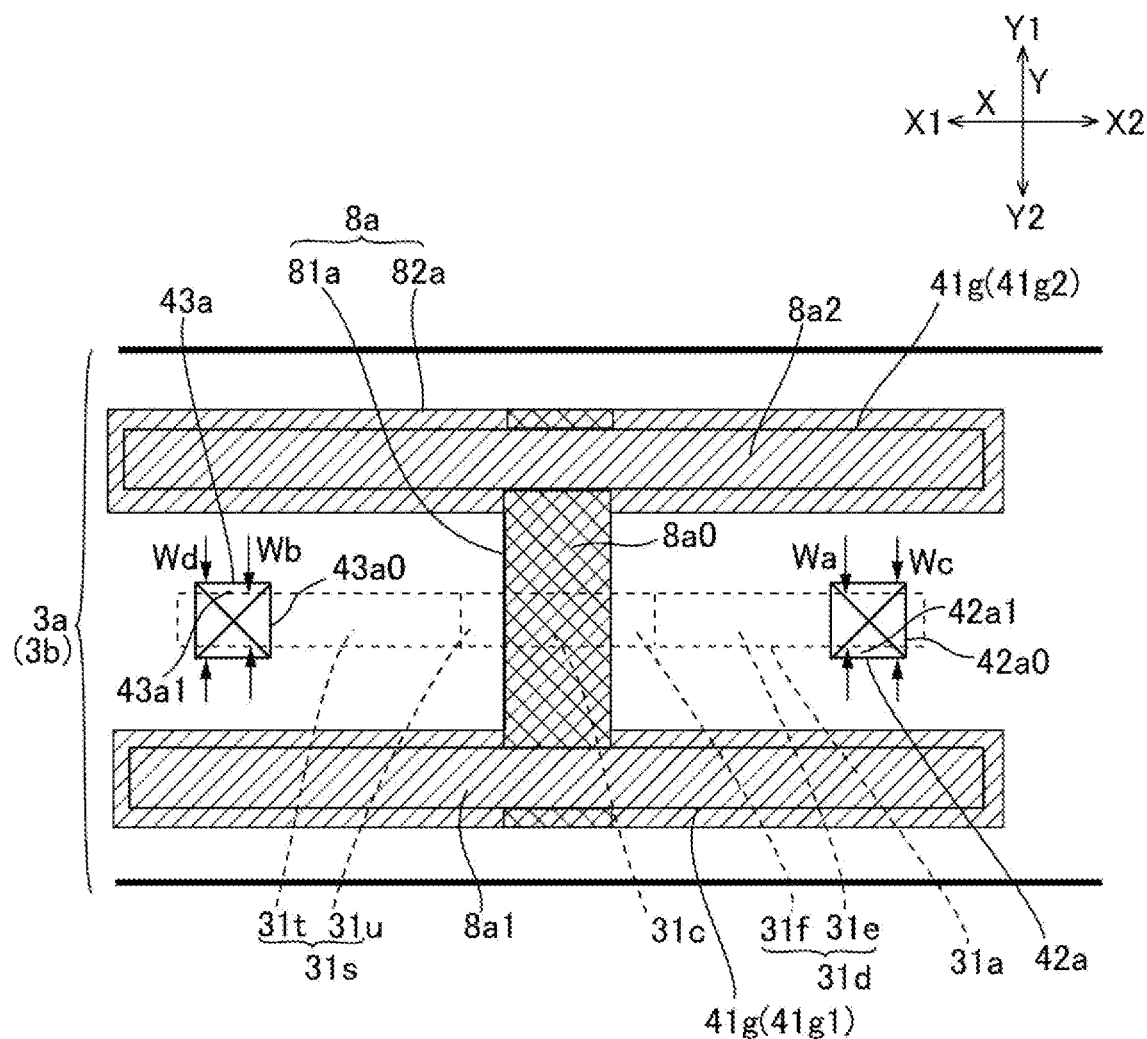
FIG. 12 is an explanatory diagram illustrating an electro-optical device according to Exemplary Embodiment 2 of the present disclosure.
Figure 13:
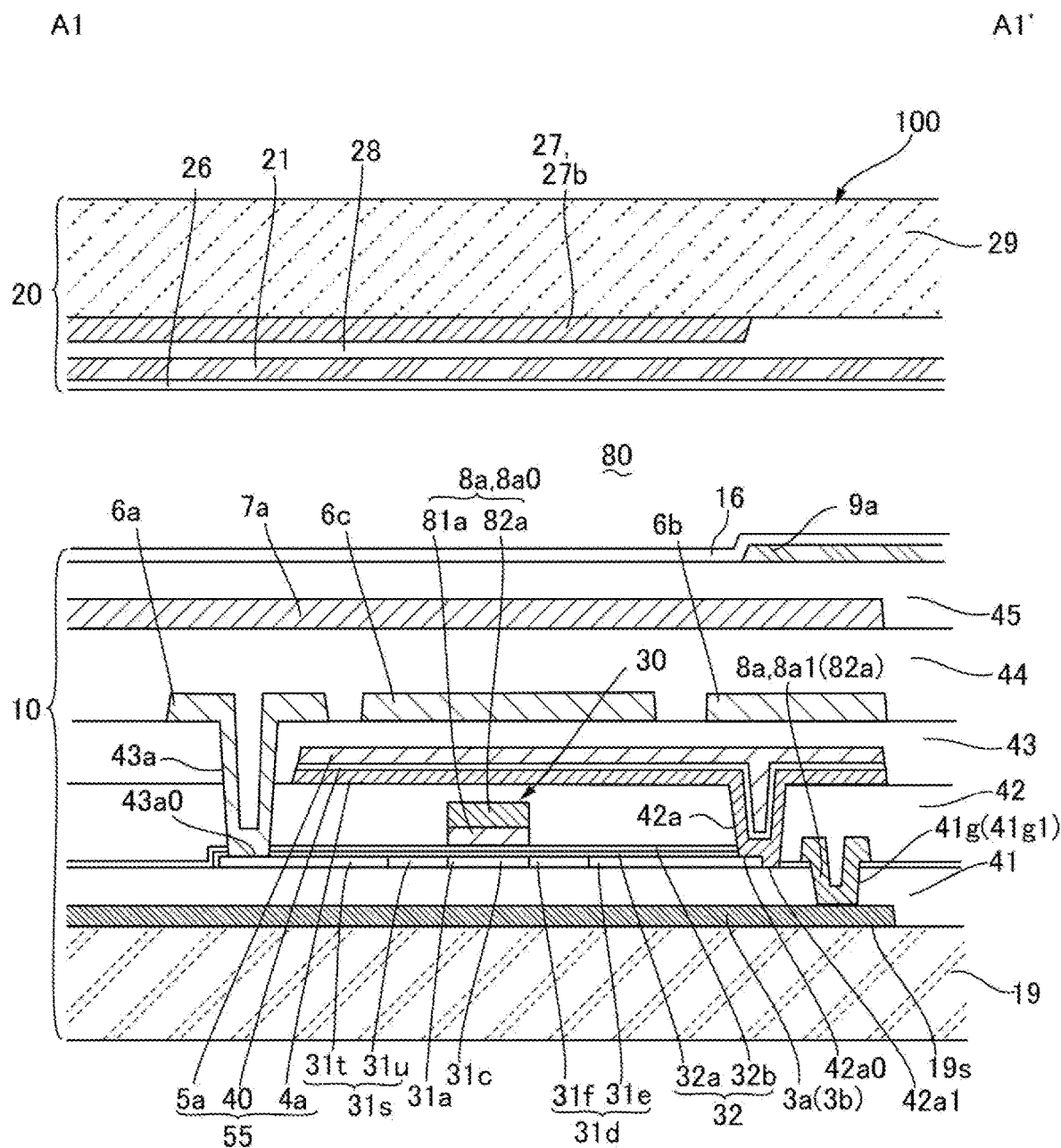
FIG. 13 is a cross-sectional view of the electro-optical device according to Exemplary Embodiment 2 of the present disclosure.

FIG. 12 is an explanatory diagram of the electro-optical device 100 according to Exemplary Embodiment 2 of the present disclosure, and corresponds to FIG. 11 of Exemplary Embodiment 1. FIG. 12 schematically illustrates an enlarged periphery of the semiconductor layer 31a. FIG. 13 is a cross-sectional view of the electro-optical device 100 according to Exemplary Embodiment 2 of the present disclosure, and corresponds to FIG. 5 of Exemplary Embodiment 1. FIG. 13 schematically illustrates a state in which the electro-optical device 100 is cut corresponding to an A1-A1' line illustrated in FIG. 4. Note that the basic configuration of this exemplary embodiment and exemplary embodiments to be described later is the same as the configuration of Exemplary Embodiment 1, and thus common portions have the same reference symbols and a description of the common portions will be omitted.

As illustrated in FIG. 12 and FIG. 13, in the present exemplary embodiment as well, the first light shielding wall 8a1 and the second light shielding wall 8a2 are provided on sides of the semiconductor layer 31a respectively in the same manner as in Exemplary Embodiment 1. In the present exemplary embodiment, the width Wa of the first contact region 31e of the semiconductor layer 31a to which the first capacitance electrode 4a is electrically coupled via the first contact hole 42a is less than the width We of the first opening portion 42a0 of the first contact hole 42a. Therefore, as the width Wa of the first contact region 31e is small, in the same manner as in Exemplary Embodiment 1, the first light shielding wall 8a1 and the second light shielding wall 8a2 can be extended from sides of the channel region 31c to sides of the first contact hole 42a respectively.

In this case, in the first opening portion 42a0, there is a portion 42a1 protruding from the first contact region 31e toward both sides in a width direction, and in this portion 42a1, the first capacitance electrode 4a and the first contact region 31e do not overlap in plan view. However, because the first capacitance electrode 4a is in contact with a side surface of the first contact region 31e, the first capacitance electrode 4a and the first contact region 31e are appropriately electrically coupled.

Additionally, the width Wb of the second contact region 31t of the semiconductor layer 31a to which the data line 6a is electrically coupled via the second contact hole 43a is less than the width Wd of the second opening portion 43a0 of the second contact hole 43a. Therefore, as the width Wb of the second contact region 31t is small, in the same manner as in Exemplary Embodiment 1, the first light shielding wall 8a1 and the second light shielding wall 8a2 can be extended from the sides of the channel region 31c to the sides of the second contact hole 43a respectively.

In this case, in the second opening portion 43a0, there is a portion 43a1 that protrudes from the second contact region 31t toward both sides in a width direction, and in this portion 43a1, the data line 6a and the second contact region 31t do not overlap in plan view. However, because the data line 6a is in contact with a side surface of the second contact region 31t, the data line 6a and the second contact region 31t are appropriately electrically coupled. The rest of the configuration is the same as Exemplary Embodiment 1, and an explanation thereof is thus omitted here.

Exemplary Embodiment 3

Figure 14:
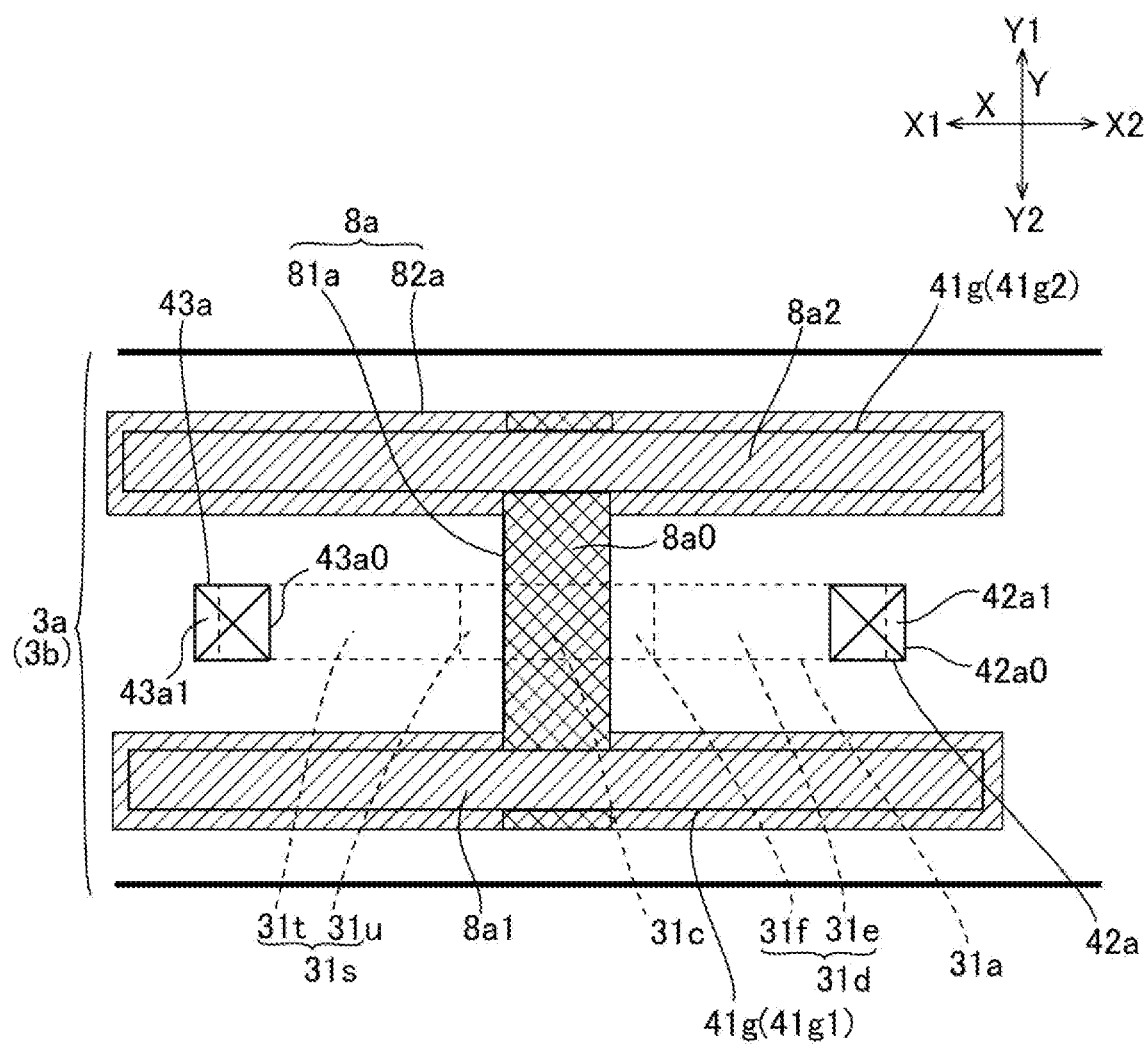
FIG. 14 is an explanatory diagram illustrating an electro-optical device according to Exemplary Embodiment 3 of the present disclosure.
Figure 15:
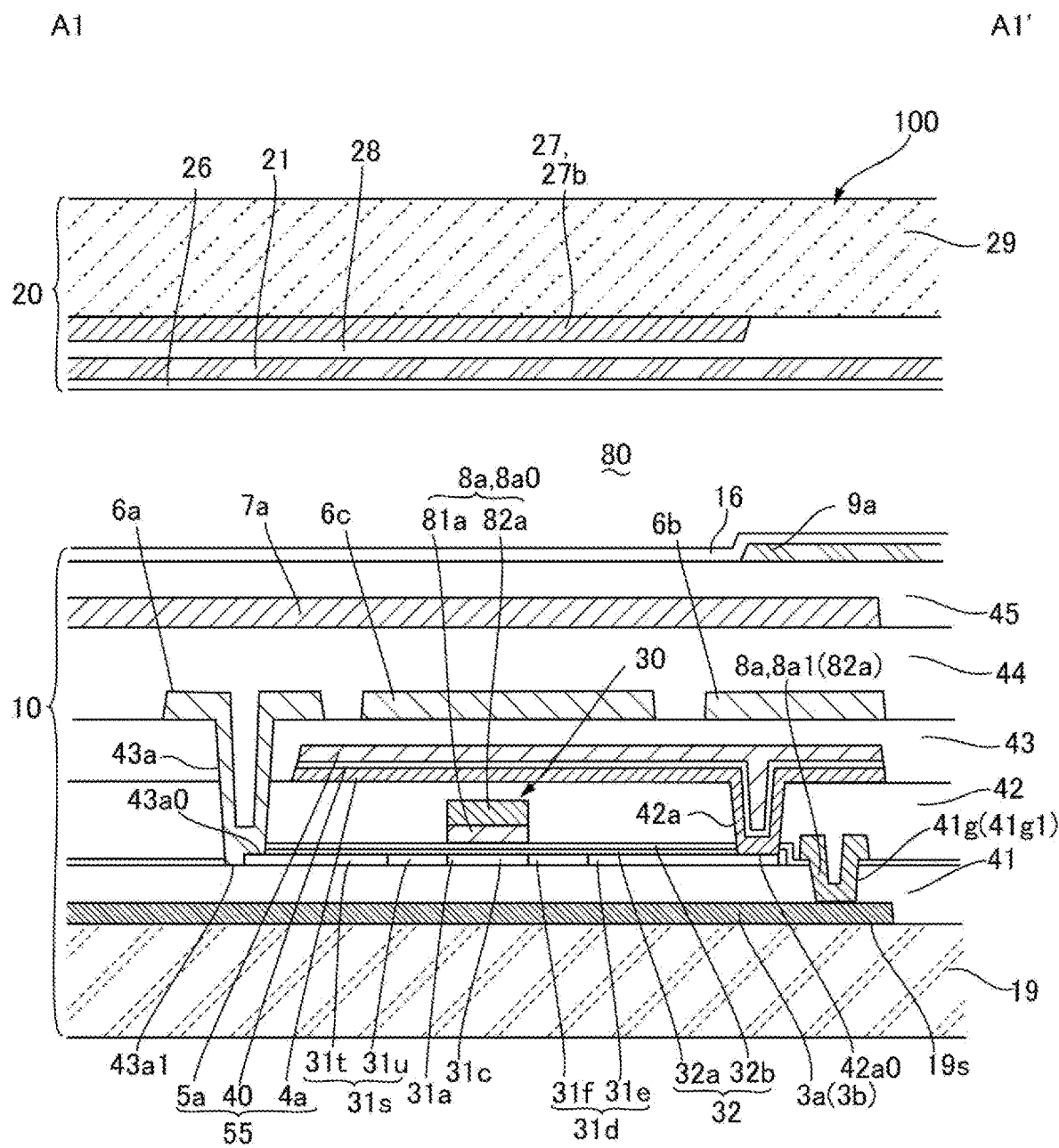
FIG. 15 is a cross-sectional view of the electro-optical device according to Exemplary Embodiment 3 of the present disclosure.

FIG. 14 is an explanatory diagram of the electro-optical device 100 according to Exemplary Embodiment 3 of the present disclosure, and corresponds to FIG. 11 of Exemplary Embodiment 1. FIG. 14 schematically illustrates an enlarged periphery of the semiconductor layer 31a. FIG. 15 is a cross-sectional view of the electro-optical device 100 according to Exemplary Embodiment 3 of the present disclosure. FIG. 15 schematically illustrates a state in which the electro-optical device 100 is cut corresponding to the A1-A1' line illustrated in FIG. 4.

As illustrated in FIG. 12 and FIG. 13, in the present exemplary embodiment as well, the first light shielding wall 8a1 and the second light shielding wall 8a2 are provided on sides of the semiconductor layer 31a respectively in the same manner as in Exemplary Embodiment 1. In the present exemplary embodiment, the width Wa of the first contact region 31e of the semiconductor layer 31a to which the first capacitance electrode 4a is electrically coupled via the first contact hole 42a is less than or equal to the width We of the first opening portion 42a0 of the first contact hole 42a. Therefore, as the width Wa of the first contact region 31e is small, in the same manner as in Exemplary Embodiment 1, the first light shielding wall 8a1 and the second light shielding wall 8a2 can be extended from sides of the channel region 31c to sides of the first contact hole 42a respectively.

In the present exemplary embodiment, in the first opening portion 42a0, there is the portion 42a1 protruding from the first contact region 31e toward a side opposite to the channel region 31c, and in this portion 42a1, the first capacitance electrode 4a and the first contact region 31e do not overlap in plan view. However, because the first capacitance electrode 4a is in contact with a side surface of the first contact region 31e, the first capacitance electrode 4a and the first contact region 31e are appropriately electrically coupled.

Further, the width Wb of the second contact region 31t of the semiconductor layer 31a to which the data line 6a is electrically coupled via the second contact hole 43a is less than or equal to the width Wd of the second opening portion 43a0 of the second contact hole 43a. Therefore, in the same manner as in Exemplary Embodiment 1, the first light shielding wall 8a1 and the second light shielding wall 8a2 can be extended from sides of the channel region 31c to sides of the second contact hole 43a respectively.

In the present exemplary embodiment, in the second opening portion 43a0, there is the portion 43a1 protruding from the second contact region 31t to a side opposite to the channel region 31c, and in this portion 43a1, the data line 6a and the second contact region 31t do not overlap in plan view. However, because the data line 6a is in contact with a side surface of the second contact region 31t, the data line 6a and the second contact region 31t are appropriately electrically coupled. The rest of the configuration is the same as Exemplary Embodiment 1, and an explanation thereof is thus omitted here.

Exemplary Embodiment 4

Figure 16:
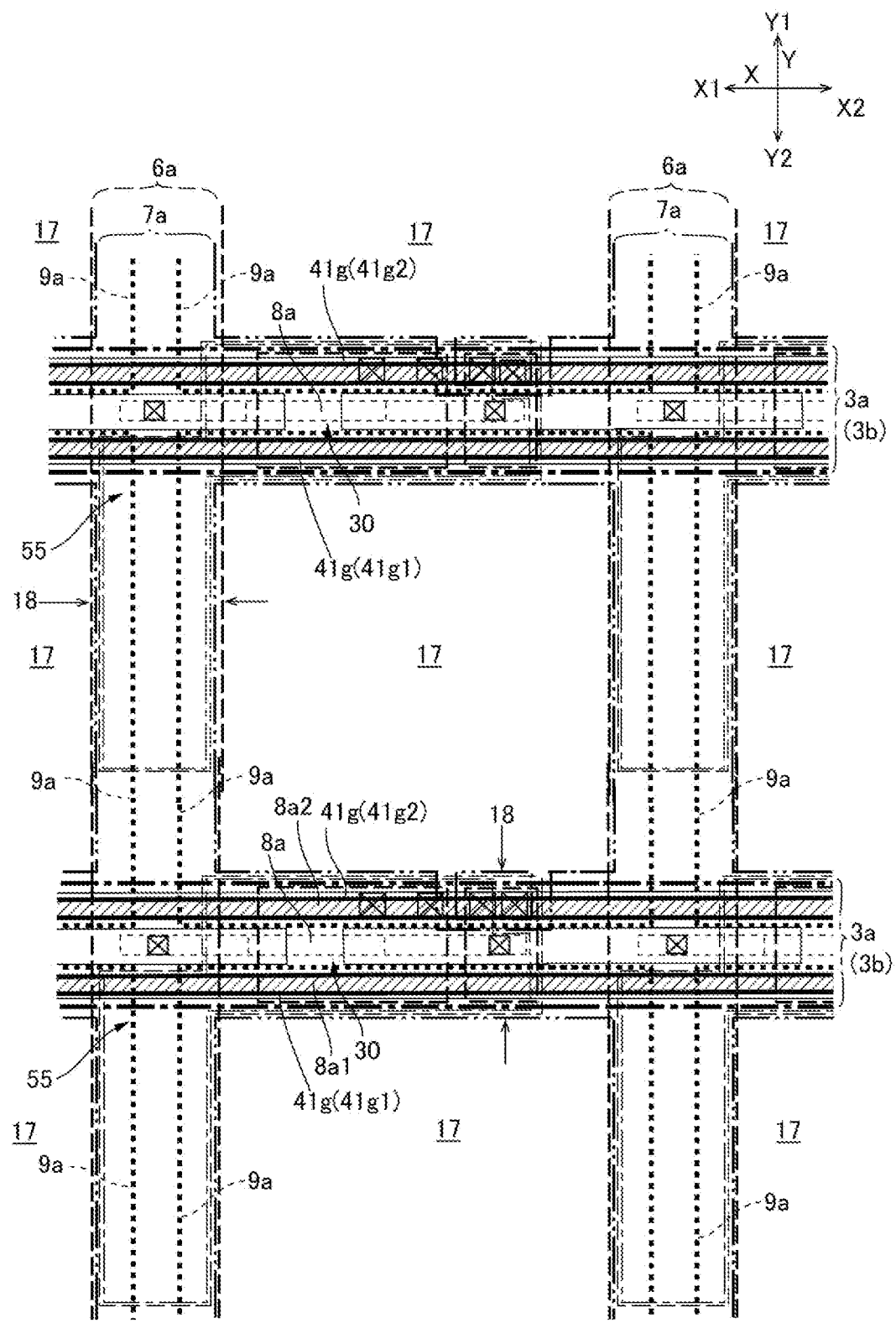
FIG. 16 is an explanatory diagram illustrating an electro-optical device according to Exemplary Embodiment 4 of the present disclosure.
Figure 17:
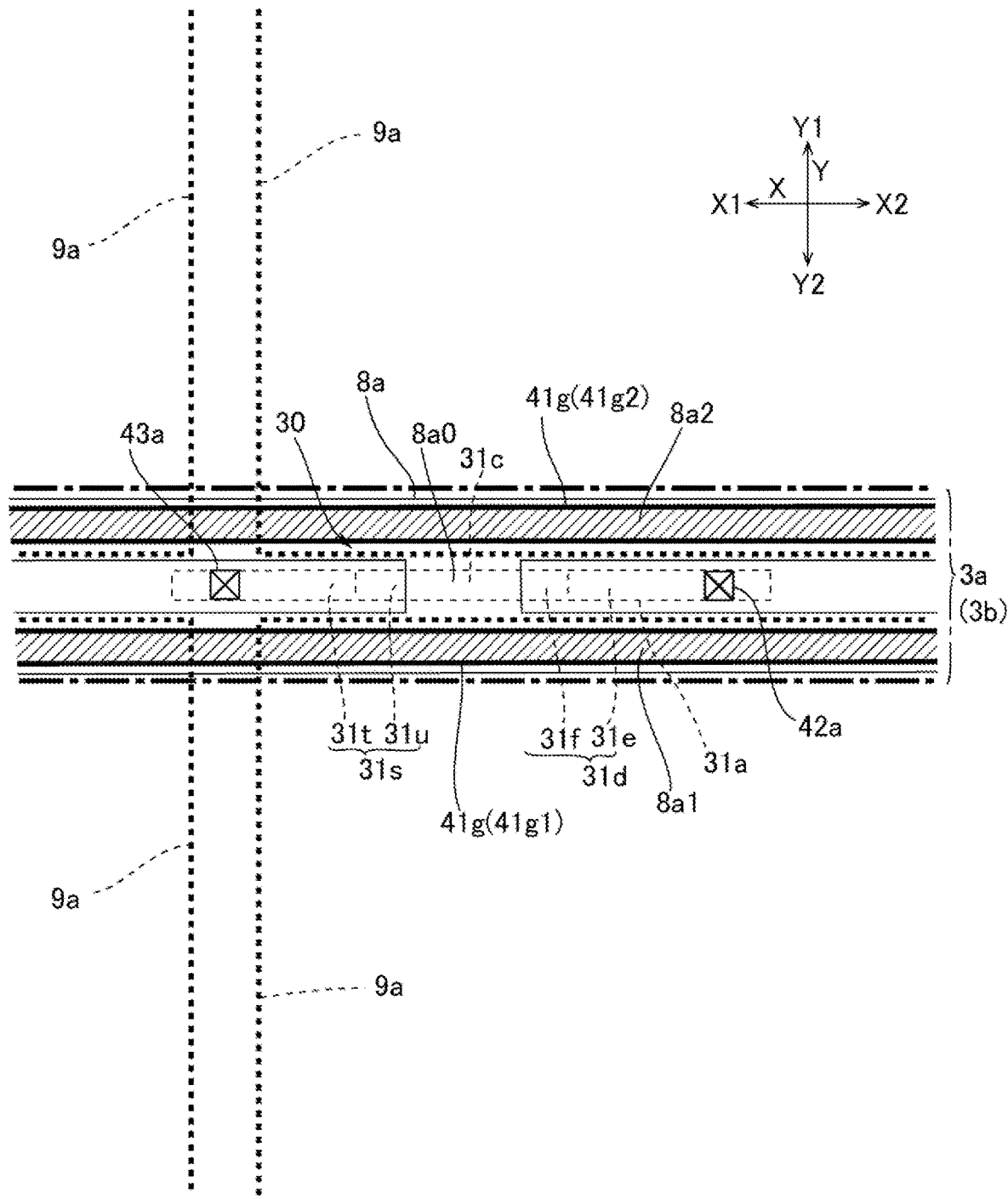
FIG. 17 is an enlarged explanatory diagram illustrating a pixel illustrated in FIG. 16.

FIG. 16 is an explanatory diagram of the electro-optical device 100 according to Exemplary Embodiment 4 of the present disclosure, and corresponds to FIG. 3 of Exemplary Embodiment 1. FIG. 16 illustrates a plan view of a plurality of pixels, similar to FIG. 3. FIG. 17 is an enlarged explanatory diagram of the pixel illustrated in FIG. 16, and corresponds to FIG. 8 of Exemplary Embodiment 1. FIG. 17, like FIG. 8, illustrates a planar configuration of the scan line 3a, the semiconductor layer 31a, the gate electrode 8a, and the like.

As illustrated in FIG. 16 and FIG. 17, in the present exemplary embodiment as well, the first light shielding wall 8a1 and the second light shielding wall 8a2 are provided on sides of the semiconductor layer 31a respectively in the same manner as in Exemplary Embodiment 1. Furthermore, in the same manner as in Exemplary Embodiment 1, the semiconductor layer 31a extends with a small width. Thus, the first light shielding wall 8a1 and the second light shielding wall 8a2 extend from sides of the channel region 31c to sides of the first contact hole 42a respectively, and extend from the sides of the channel region 31c to sides of the second contact hole 43a respectively.

In the present exemplary embodiment, at least one of the first light shielding wall 8a1 and the second light shielding wall 8a2 constitutes redundant wiring for scan signals extending continuously along the scan line 3a in a display region. In the present exemplary embodiment, both the first light shielding wall 8a1 and the second light shielding wall 8a2 constitute redundant wiring for scan signals extending continuously along the scan line 3a in a display region. Thus, even when a width of the scan line 3a is decreased and a pixel opening ratio is increased, the same effect as when electrical resistance of the scan line 3a is reduced can be obtained. The rest of the configuration is the same as Exemplary Embodiment 1, and an explanation thereof is thus omitted here.

Exemplary Embodiment 5

Figure 18:
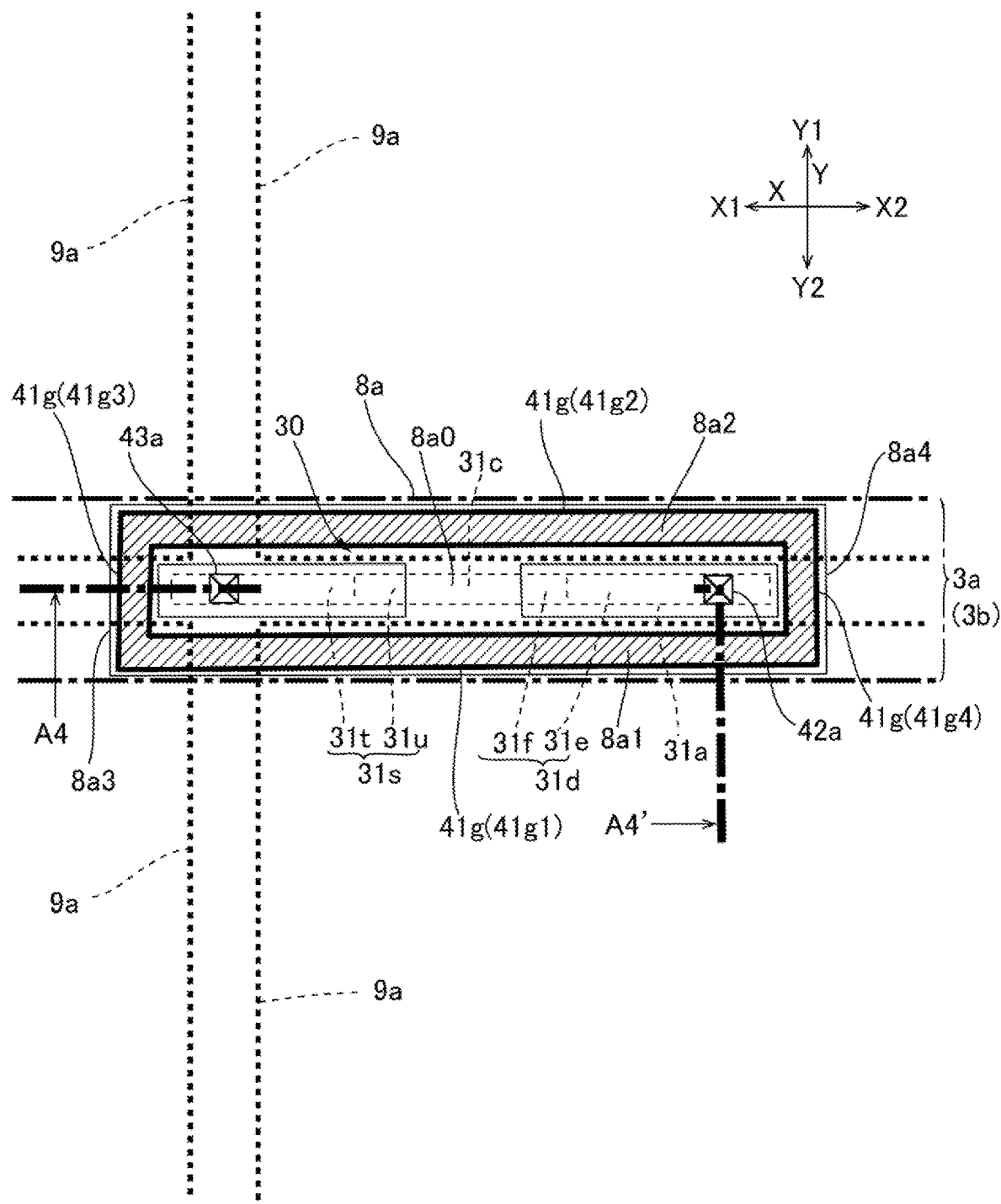
FIG. 18 is an explanatory diagram illustrating an electro-optical device according to Exemplary Embodiment 5 of the present disclosure.
Figure 19:
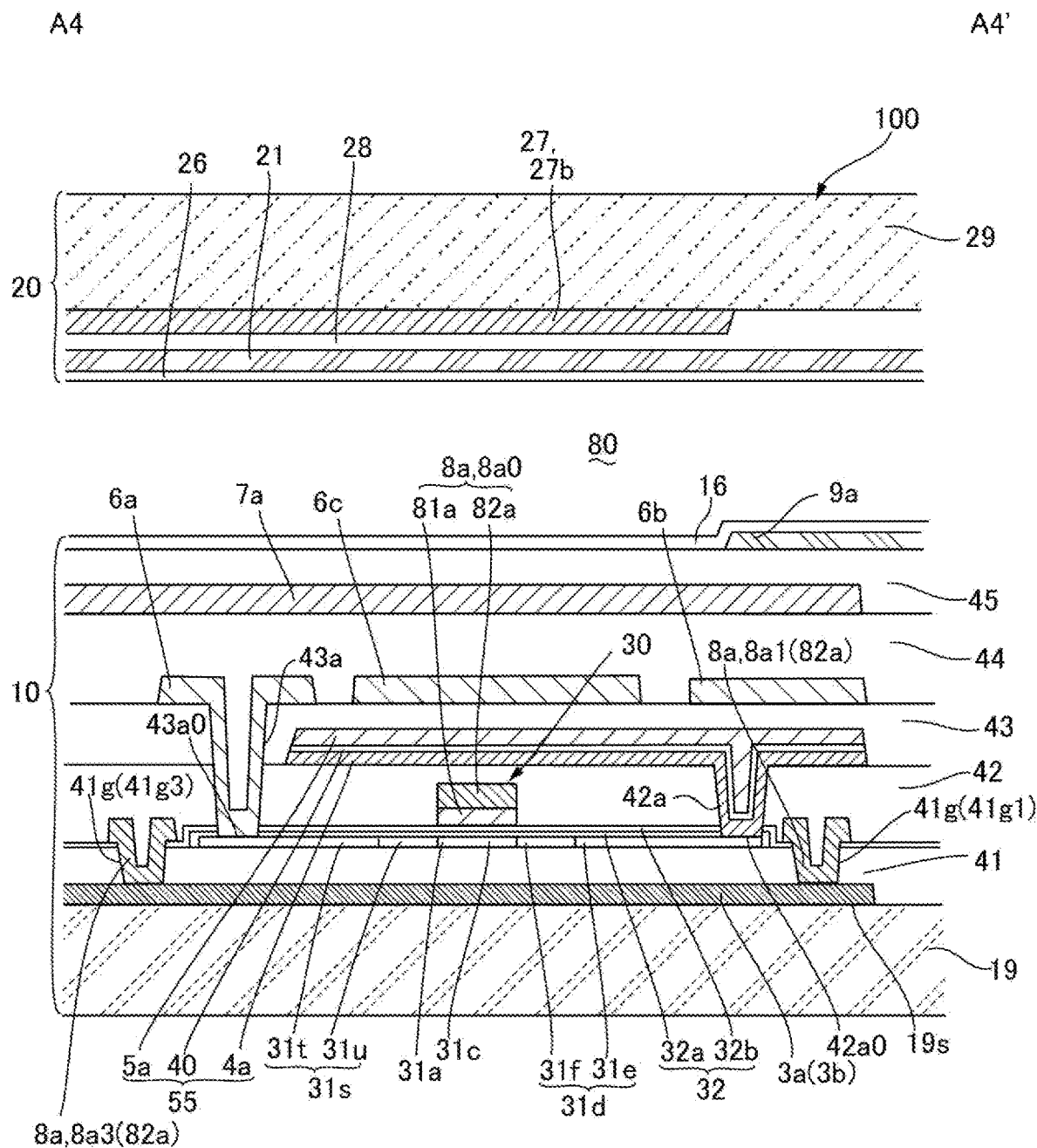
FIG. 19 is a cross-sectional view of the electro-optical device according to Exemplary Embodiment 5 of the present disclosure.

FIG. 18 is an explanatory diagram of the electro-optical device 100 according to Exemplary Embodiment 5 of the present disclosure, and corresponds to FIG. 8 of Exemplary Embodiment 1. FIG. 18, like FIG. 8, illustrates a planar configuration of the scan line 3a, the semiconductor layer 31a, the gate electrode 8a, and the like. FIG. 19 is a cross-sectional view of the electro-optical device 100 according to Exemplary Embodiment 5 of the present disclosure. FIG. 19 illustrates a state in which the electro-optical device 100 is cut along an A4-A4' line illustrated in FIG. 18.

As illustrated in FIG. 18 and FIG. 19, in the present exemplary embodiment as well, the first light shielding wall 8a1 and the second light shielding wall 8a2 are provided on sides of the semiconductor layer 31a respectively in the same manner as in Exemplary Embodiment 1. Furthermore, in the same manner as in Exemplary Embodiment 1, the semiconductor layer 31a extends with a small width. Thus, the first light shielding wall 8a1 and the second light shielding wall 8a2 extend from sides of the channel region 31c to sides of the first contact hole 42a respectively, and extend from the sides of the channel region 31c to sides of the second contact hole 43a respectively.

Here, of a plurality of semiconductor layers 31a disposed along the scan line 3a, between the two semiconductor layers 31a adjacent in an extension direction of the scan line 3a, the first light shielding wall 8a1 and the second light shielding wall 8a2 are coupled via a third light shielding wall 8a3 and a fourth light shielding wall 8a4. More specifically, the groove 41g includes a third groove 41g3 and a fourth groove 41g4 that each couples end portions of the first groove 41g1 and the second groove 41g2 respectively, and the light-shielding conductive film 82a of the gate electrode 8a configures the first light shielding wall 8a1 and the second light shielding wall 8a2 inside the first groove 41g1 and the second groove 41g2 respectively, and configures the third light shielding wall 8a3 and the fourth light shielding wall 8a4 inside the third groove 41g3 and the fourth groove 41g4 respectively.

According to such a configuration, an effect is exhibited in which light traveling along the scan line 3a is less likely to travel between the semiconductor layer 31a and the first light shielding wall 8a1, and between the semiconductor layer 31a and the second light shielding wall 8a2. The rest of the configuration is the same as Exemplary Embodiment 1, and an explanation thereof is thus omitted here.

Other Exemplary Embodiments

In the exemplary embodiment described above, the gate electrode 8a has the two-layer structure of the polysilicon film 81a and the light shielding conductive film 82a, but the present disclosure may be applied when the gate electrode 8a is constituted by a single layer film of the light shielding conductive film 82a.

The exemplary embodiment described above has the configuration in which the semiconductor layer 31a extends in the first direction X along the scan line 3a, but the present disclosure may be applied when the semiconductor layer 31a extends in the second direction Y at an intersection of the scan line 3a and the data line 6a. In this case, the scan line 3a includes a protruding portion that protrudes in the second direction Y at the intersection of the scan line 3a and the data line 6a, and the scan line 3a overlaps in plan view with the semiconductor layer 31a, by such a protruding portion.

In the exemplary embodiment described above, the light shielding layer 3b is the scan line 3a, but the present disclosure may be applied when the plurality of light shielding layers 3b are disposed along the first direction X. In the exemplary embodiment described above, each of the first contact hole 42a and the second contact hole 43a is square, but may be rectangular with a long side facing in an extension direction of the semiconductor layer 31a, or an ellipse with a long axis facing in the extension direction of the semiconductor layer 31a.

In the exemplary embodiment described above, the data line 6a, the relay electrode 6c, and the capacitance line 7a constitute the light shielding member overlapping in plan view with the semiconductor layer 31a from the pixel electrode 9a side, but at least one of the first capacitance electrode 4a and the second capacitance electrode 5a may be a light shielding electrode, and a light shielding member overlapping in plan view with the semiconductor layer 31a from the pixel electrode 9a side may be constituted by such a light shielding electrode. In the exemplary embodiment described above, the surface of the first interlayer insulating layer 41 is flattened, but the present disclosure may be applied when the surface of the first interlayer insulating layer 41 is not flattened. Further, in the exemplary embodiment described above, the surface of the second interlayer insulating layer 42 is flattened, but the present disclosure may be applied when the surface of the second interlayer insulating layer 42 is not flattened.

In the exemplary embodiment described above, the description has been given using the electro-optical device 100 as the example in which light source light is incident from the second substrate 20 side, but the present disclosure may also be applied to the electro-optical device 100 in which light source light is incident from the first substrate 10 side. In the exemplary embodiment described above, the case where the electro-optical device 100 is the transmissive liquid crystal device has been illustrated, however, the present disclosure may be applied to a case in which the electro-optical device 100 is a reflection-type liquid crystal device. In addition, the present disclosure may be applied to a case in which the electro-optical device 100 is an organic electroluminescence display device.

Installation Example to Electronic Apparatus

Figure 20:
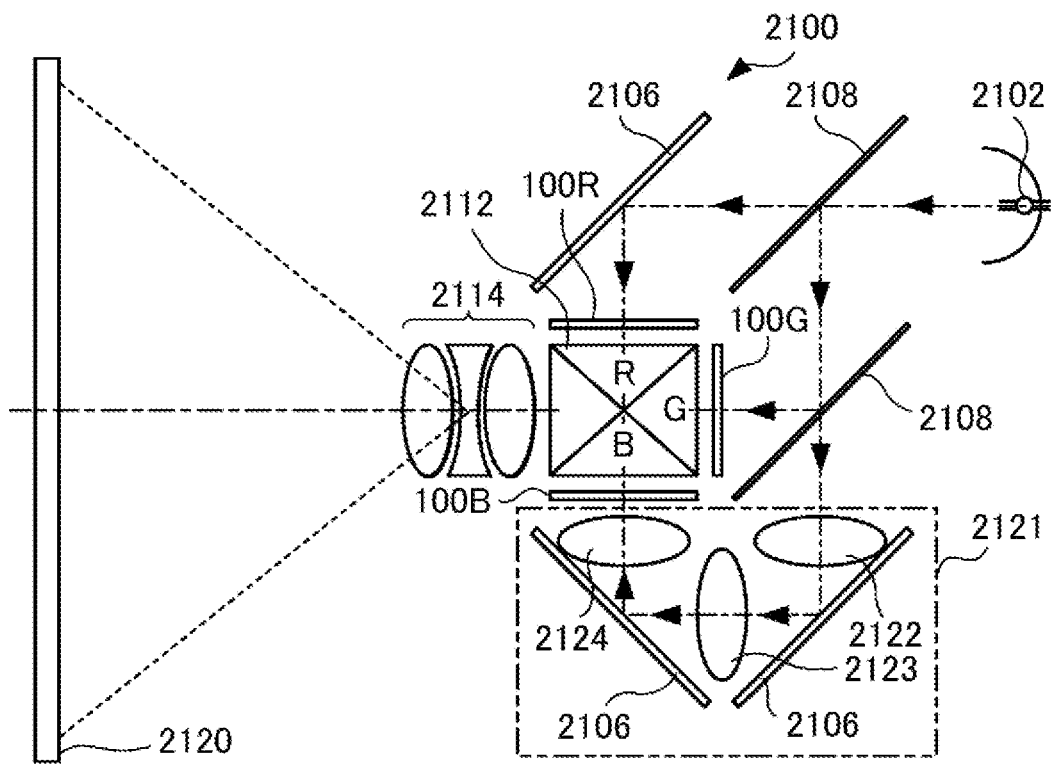
FIG. 20 is a schematic configuration diagram illustrating a projection-type display apparatus employing an electro-optical device to which the present disclosure is applied.

An electronic apparatus using the electro-optical device 100 according to the above-described exemplary embodiments will be described below. FIG. 20 is a schematic configuration diagram illustrating a projection-type display device employing the electro-optical device 100 to which the present disclosure is applied. Illustration of an optical element such as a polarizing plate is omitted in FIG. 20. A projection-type display apparatus 2100 illustrated in FIG. 20 is an example of an electronic apparatus employing the electro-optical device 100. The projection-type display device 2100, in which the electro-optical device 100 is used as a light valve, can conduct high-definition and bright display without making the apparatus large. As illustrated in this figure, a light source unit 2102 configured by a lamp unit including a white light source such as a halogen lamp and the like is provided inside the projection-type display apparatus 2100. Projection light emitted from the light source unit 2102 is split into three primary colors of R (red), G (green), and B (blue) by three mirrors 2106 and two dichroic mirrors 2108 installed inside. The split incident light is guided to light valves 100R, 100G, and 100B corresponding to each of the primary colors, and then modulated. Note that since the light of the B color has a long optical path as compared to the other light of the R color and the G color, the light of the B color is guided via a relay lens system 2121 including an incidence lens 2122, a relay lens 2123, and an emission lens 2124 to prevent a loss due to the long optical path of the light of the B color.

The light modulated by each of the light valves 100R, 100G, and 100B is incident on a dichroic prism 2112 from three directions. Then, at the dichroic prism 2112, the light of the R color and the light of the B color are reflected at 90 degrees, and the light of the G color is transmitted. Accordingly, the images of the respective primary colors are synthesized, and subsequently a color image is projected on a screen 2120 by a projection optical system 2114.

Other Projection-Type Display Apparatuses

Note that the projection-type display apparatus may include a configuration in which an LED light source or the like configured to emit light of each color is used as a light source unit and the light of each color emitted from the LED light source is supplied to another liquid-crystal device.

Other Electronic Apparatuses

The electronic apparatus including the electro-optical device 100 to which the present disclosure is applied is not limited to the projection-type display device 2100 of the above-described exemplary embodiment. Examples of the electronic apparatus may include a projection-type head up display, a direct-view-type head mounted display, a personal computer, a digital still camera, and a liquid crystal television.

What is claimed is:

1. An electro-optical device, comprising:
a substrate body;
a transistor including a semiconductor layer including a first source drain region, a channel region, and a second source drain region;
a first interlayer insulating layer provided in a layer between the substrate body and the semiconductor layer;
a light shielding layer overlapping in plan view with the semiconductor layer in a layer between the substrate body and the first interlayer insulating layer;
a first light shielding wall penetrating the first interlayer insulating layer so as to reach the light shielding layer through a side of the semiconductor layer;
a second light shielding wall penetrating the first interlayer insulating layer so as to reach the light shielding layer on a side of the semiconductor layer opposite to the first light shielding wall;
a second interlayer insulating layer configured to cover the transistor from a side opposite to the substrate body;
a first data line; and
a second data line adjacent to the first data line, wherein
an entirety of the semiconductor layer has a constant width along an extension direction of the semiconductor layer,
the second interlayer insulating layer is provided with a first contact hole extending through the second interlayer insulating layer to reach the first source drain region,
a width of the first source drain region is the same as a width of a first opening portion of the first contact hole that opens on a side of the first source drain region, or is less than the width of the first opening portion,
the first source drain region includes a first contact region and a first low concentration region provided between the first contact region and the channel region,
the second source drain region includes a second contact region and a second low concentration region provided between the second contact region and the channel region,
the first contact region overlaps with the first data line in plan view,
the first low concentration region, the channel region, the second low concentration region, and the second contact region are provided between the first data line and the second data line in plan view,
the first light shielding wall and the second light shielding wall extend from a side of the first contact region to a side of the second contact region, and
a part of the first light shielding wall and a part of the second light shielding wall overlap with the first data line in plan view.

2. The electro-optical device according to claim 1, wherein
the first light shielding wall and the second light shielding wall extend from a side of the channel region to a side of the first contact hole.

3. The electro-optical device according to claim 1, wherein
a part of the first opening portion protrudes in a width direction from the first source drain region.

4. The electro-optical device according to claim 1, wherein
the second interlayer insulating layer is provided with a second contact hole extending through the second interlayer insulating layer to reach the second source drain region, and
a width of the second source drain region is the same as a width of a second opening portion of the second contact hole that opens on a side of the second source drain region, or is smaller than the width of the second opening portion.

5. The electro-optical device according to claim 4, wherein
the first light shielding wall and the second light shielding wall extend from a side of the channel region to a side of the second source drain region.

6. The electro-optical device according to claim 4, wherein
a part of the second opening portion protrudes in a width direction from the second source drain region.

7. The electro-optical device according to claim 1, wherein
the light shielding layer is a scan line, and
each of the first light shielding wall and the second light shielding wall is made of a light shielding conductive material that electrically couples a gate electrode of the transistor and the scan line inside a groove extending through the first interlayer insulating layer.

8. The electro-optical device according to claim 7, wherein
the semiconductor layer extends along the scan line.

9. The electro-optical device according to claim 8, wherein
a plurality of the semiconductor layers are disposed along the scanning line, and
at least one of the first light shielding wall and the second light shielding wall constitutes redundant wiring for a scan signal extending continuously along the scan line in a display region.

10. The electro-optical device according to claim 8, wherein
a plurality of the semiconductor layers are disposed along the scan line, and
between two semiconductor layers adjacent to each other in an extension direction of the scan line among the plurality of semiconductor layers, the first light shielding wall is coupled with the second light shielding wall.

11. An electronic apparatus comprising the electro-optical device according to claim 1.

12. The electro-optical device according to claim 1, wherein
the first contact region has a first side along the extension direction of the semiconductor layer and a second side opposite to the first side, and
a part of the first opening portion protrudes from at least one of the first side and the second side in plan view.

* * * * *